US012320033B2

(12) United States Patent
Park et al.

(10) Patent No.: US 12,320,033 B2
(45) Date of Patent: Jun. 3, 2025

(54) SILICON CARBIDE WAFER AND METHOD OF PREPARING THE SAME

(71) Applicant: SENIC INC., Cheonan-si (KR)

(72) Inventors: Jong Hwi Park, Suwon-si (KR); Kap-Ryeol Ku, Suwon-si (KR); Jung Woo Choi, Suwon-si (KR); Byung Kyu Jang, Suwon-si (KR); Myung-Ok Kyun, Suwon-si (KR); Jung-Gyu Kim, Suwon-si (KR); Jung Doo Seo, Suwon-si (KR)

(73) Assignee: SENIC INC., Cheonan-si (KR)

(*) Notice: Subject to any disclaimer, the term of this patent is extended or adjusted under 35 U.S.C. 154(b) by 890 days.

(21) Appl. No.: 17/477,856

(22) Filed: Sep. 17, 2021

(65) Prior Publication Data
US 2022/0090295 A1 Mar. 24, 2022

(30) Foreign Application Priority Data

Sep. 22, 2020 (KR) .................. 10-2020-0122140
Nov. 27, 2020 (KR) .................. 10-2020-0162936
Nov. 27, 2020 (KR) .................. 10-2020-0163017

(51) Int. Cl.
C30B 29/36 (2006.01)
C30B 23/00 (2006.01)
(Continued)

(52) U.S. Cl.
CPC .............. C30B 29/36 (2013.01); C30B 23/02 (2013.01); C30B 33/00 (2013.01); H10D 30/668 (2025.01); H10D 62/8325 (2025.01)

(58) Field of Classification Search
CPC ......... C30B 29/36; C30B 23/02; C30B 23/00; C30B 23/002; C30B 33/00; H10D 62/8325
See application file for complete search history.

(56) References Cited

U.S. PATENT DOCUMENTS

2017/0236905 A1   8/2017  Torimi et al.
2024/0271322 A1*  8/2024  Lin ....................... C01B 32/956

FOREIGN PATENT DOCUMENTS

EP    3 816 329 A1    5/2021
EP    3 926 079 A1   12/2021
(Continued)

OTHER PUBLICATIONS

Yan, Q. S., et al., "Surface and Subsurface Damage Characteristics and Material Removal Mechanism in 6H-SiC Wafer Grinding", Materials Research Innovations, vol. 18, 2014, (6 Pages in English).

(Continued)

Primary Examiner — Antonio B Crite
(74) Attorney, Agent, or Firm — NSIP Law

(57) ABSTRACT

The method of preparing a silicon carbide ingot includes: disposing a raw material and a silicon carbide seed crystal to be separated in a reactor having an internal space; adjusting a temperature, a pressure, and an atmosphere of the internal space for sublimating the raw material and growing the silicon carbide ingot on the silicon carbide seed crystal; and cooling the reactor and retrieving the silicon carbide ingot, wherein the adjusting proceeds in a first inert gas atmosphere having a flow quantity of 100 sccm to 300 sccm, the cooling proceeds in a second inert gas atmosphere having a flow quantity of 1 sccm to 250 sccm, and the reactor has a thermal conductivity of 120 W/mK or less.

20 Claims, 8 Drawing Sheets

(51) Int. Cl.
    *C30B 23/02*     (2006.01)
    *C30B 33/00*     (2006.01)
    *H01L 21/02*     (2006.01)
    *H10D 30/66*     (2025.01)
    *H10D 62/832*     (2025.01)

(56) References Cited

FOREIGN PATENT DOCUMENTS

| | | |
|---|---|---|
| JP | 3708810 B2 | 10/2005 |
| JP | 2008-105896 A | 5/2008 |
| JP | 2010-202485 A | 9/2010 |
| JP | 2015-207695 A | 11/2015 |
| JP | 2016-88794 A | 5/2016 |
| JP | 2016-171197 A | 9/2017 |
| JP | 6281636 B2 | 2/2018 |
| JP | 2018-37560 A | 3/2018 |
| JP | 2019-91798 A | 6/2019 |
| JP | 2019-528233 A | 10/2019 |
| JP | 2020-93965 A | 6/2020 |
| KR | 10-2006-0019868 A | 3/2006 |
| KR | 10-2010-0089103 A | 8/2010 |
| KR | 10-1586820 B1 | 2/2016 |
| KR | 10-2017-0061606 A | 6/2017 |
| KR | 10-2017-0076763 A | 7/2017 |
| KR | 10-1760030 B1 | 8/2017 |
| KR | 10-2018-0010344 A | 1/2018 |
| KR | 10-2019-0135504 A | 12/2019 |
| KR | 10-2068933 B1 | 1/2020 |
| KR | 10-2109292 B1 | 5/2020 |
| WO | WO 2011/024931 A1 | 3/2011 |
| WO | WO 2017/057742 A1 | 4/2017 |

OTHER PUBLICATIONS

Nuruzzaman, Md, et al., "Structural, Elastic and Electronic Properties of 2H-and 4H-SiC", International Journal of Engineering Research and Applications, vol. 5, Issue 5, May 2015, (p. 48-52).

European Office Action issued on Feb. 4, 2022, in Counterpart European Patent Application No. 21197461.3 (61 Pages in English).

Barbato, Giulio, et al., ""Zero-Point" in the Evaluation of Martens Hardness Uncertainty." VDI Berichte, 1685, 2002 (pp. 113-120).

Nagy, P.M et al., "Nanoindentation of Silicon", *Materials Science Forum*, vols. 604-605, 2009 (pp. 29-36).

Rohbeck, Nadia et al., "High Temperature Nanoindentation of Irradiated Silicon Carbide," Transactions, SMiRT-23, Manchester, United Kingdom—Aug. 10-14, 2015 (pp. 1-8).

Japanese Office Action Issued on Mar. 5, 2025, in Counterpart Japanese Patent Application No. 2024-007015 (5 Pages in English, 5 Pages in Japanese).

* cited by examiner

SILICON CARBIDE WAFER AND METHOD OF PREPARING THE SAME

CROSS-REFERENCE TO RELATED APPLICATIONS

This application claims the benefit under 35 U.S.C. 119(a) of Korean Patent Application No. 10-2020-0122140 filed on Sep. 22, 2020, Korean Patent Application No. 10-2020-0163017 filed on Nov. 27, 2020, and Korean Patent Application No. 10-2020-0162936 filed on Nov. 27, 2020 in the Korean Intellectual Property Office, the entire disclosures of which are incorporated herein by reference for all purposes.

BACKGROUND

1. Field

The present disclosure relates to a method of preparing a silicon carbide ingot, a silicon carbide wafer, a semiconductor device including the silicon carbide wafer, and a method of preparing the silicon carbide wafer.

2. Description of the Background

Silicon Carbide (SiC) is a semiconductor having a wide band gab of 2.2 eV to 3.3 eV, and research of which are proceeding as a semiconductor material due to the excellent physical and chemical properties.

As a method for preparing a silicon carbide single crystal, there are Liquid Phase Epitaxy (LPE), Chemical Vapor Deposition (CVD), Physical Vapor Transport (PVT), and the like. Among them, PVT is a method of growing a silicon carbide single crystal as follows: loads a silicon carbide raw material into a crucible, disposes a seed crystal composed of a silicon carbide single crystal on the top of the crucible, and then heat the crucible by an induction heating method to sublimate the raw material to grow the silicon carbide single crystal on the seed crystal.

PVT is the most widely used method for manufacturing silicon carbide in the form of an ingot because it has a high growth rate. However, depending on crucible properties, process conditions, and the like, current density may change and temperature distribution inside a crucible may also change. Therefore, it has difficulties in securing proper mechanical properties of a silicon carbide ingot and a silicon carbide wafer thereby.

A further improved method is required for manufacturing a silicon carbide ingot and wafer, whose excessive deformation or damage due to external reasons is minimized, and which satisfies proper mechanical properties.

The above-described background technology is technical information acquired by the inventor for derivation of an embodiment or during the derivation process, and is not necessarily a prior art disclosed to the general public before filing of the present disclosure.

As a related prior art, there is "Manufacturing method for Silicon Carbide Single Crystal and Silicon Carbide Single Crystal Substrate" as disclosed in Korean Patent Publication No. 10-2017-0076763 and "Silicon Carbide Single Crystal Ingot, Substrate and Epitaxial Wafer Obtained from the Same" as disclosed in Korean Patent Publication No. 10-2010-0089103.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method of preparing a silicon carbide ingot may include: disposing a raw material and a silicon carbide seed crystal to be separated in a reactor having an internal space; adjusting a temperature, a pressure, and an atmosphere of the internal space for sublimating the raw material and growing the silicon carbide ingot on the silicon carbide seed crystal; and cooling the reactor and retrieving the silicon carbide ingot, wherein the adjusting may proceed in a first inert gas atmosphere having a flow quantity of 100 sccm to 300 sccm, the cooling may proceed in a second inert gas atmosphere having a flow quantity of 1 sccm to 250 sccm, and the reactor may have a thermal conductivity of 120 W/mK or less.

In one embodiment, the reactor may have a thermal conductivity of 85 W/mK or more.

In one embodiment, the reactor may include a heat insulating material surrounding the reactor; a reacting chamber disposed in the internal space; and a heating means disposed in an external space of the reacting chamber, wherein the heat insulating material may have a thermal conductivity of 1.24 W/mK or less at 2000° C.

In one embodiment, the silicon carbide seed crystal may have a diameter of four inches or more and may include a 4H-silicon carbide structure.

In another general aspect, a method of preparing a silicon carbide wafer may include: disposing a raw material and a silicon carbide seed crystal to be separated in a reactor having an internal space; adjusting a temperature, a pressure, and an atmosphere of the internal space for sublimating the raw material and growing a silicon carbide ingot on the silicon carbide seed crystal; cooling the reactor and retrieving the silicon carbide ingot; and cutting the silicon carbide ingot to prepare the silicon carbide wafer, wherein the adjusting may proceed in a first inert gas atmosphere having a flow quantity of 100 sccm to 300 sccm, the cooling may proceed in a second inert gas atmosphere having a flow quantity of 1 sccm to 250 sccm, and the reactor may have a thermal conductivity of 120 W/mK or less.

In one embodiment, the method of preparing the silicon carbide wafer may further include wrapping and surface polishing the silicon carbide wafer after the cutting.

In one embodiment, the silicon carbide wafer may have a reduced elastic modulus of 300 GPa to 370 GPa, and a hardness of 35 GPa to 48 GPa, wherein the reduced elastic modulus and the hardness are measured according to a nanoindentation test, in which an indenter in a trigonal pyramid (Berkovich) shape is added in a load of 10 mN.

In one embodiment, the nanoindentation test measures arbitrary ten points, except for a ring area occupying a width of 10 mm in a direction from an outermost edge to a center of the silicon carbide wafer.

In one embodiment, the silicon carbide wafer may have a diameter of four inches or more, may include a 4H-silicon carbide structure, and may include: a Si surface as a first side, where a silicon atom layer is exposed on the Si surface; and a C surface as a second side, where a carbon atom layer is exposed on the C surface.

In one embodiment, the silicon carbide wafer may have a crack occurrence dropping weight height of 100 mm or more, which is measured by a DuPont impact tester with a sample having a thickness of 360 μm and a weight of 25 g.

In one embodiment, the reduced elastic modulus may have a standard deviation of 5.5 GPa or less, and the hardness may have a standard deviation of 1.1 GPa or less.

In one embodiment, a semiconductor device may include the silicon carbide wafer according to the above; an epitaxial layer disposed on a first side of the silicon carbide wafer; a barrier area disposed on the epitaxial layer; a source electrode disposed in contact with the epitaxial layer; a gate electrode disposed on the barrier area; and a drain electrode disposed on a second side of the silicon carbide wafer.

In one embodiment, the silicon carbide wafer may include, a first side where more silicon atoms than carbon atoms are exposed on a surface of the first side and a second side where more carbon atoms than silicon atoms are exposed on a surface of the second side, wherein a second reduced elastic modulus of the second side Ec and a first reduced elastic modulus of the first side Esi has a ratio Ec/Esi of 0.8 to 1.15, a second hardness of the second side Hc and a first hardness of the first side His has a ratio of Hc/His of 0.85 to 1.15, the second reduced elastic modulus of the second side, the first reduced elastic modulus of the first side, the second hardness of the second side, and the first hardness of the first side are measured according to a nanoindentation test, in which an indenter in a trigonal pyramid shape is added in a load of 10 mN, and the nanoindentation test has an average value of values measured at arbitrary ten points, except for a ring area occupying a width of 10 mm in a direction from an outermost edge to a center of the silicon carbide wafer.

In one embodiment, the first side may have a micropipe density of $1/cm^2$ or less, a Threading Edge Dislocation (TED) density of $9000/cm^2$ or less, and a Basal Plane Dislocation (BPD) density of $4000/cm^2$ or less.

In one embodiment, the first side may have the first reduced elastic modulus Esi of 300 GPa to 350 GPa.

In one embodiment, the first reduced elastic modulus may have a standard deviation of 5.5 GPa or less, and the first hardness may have a standard deviation of 1.1 GPa or less.

In one embodiment, the indenter may be a trigonal pyramid having a base plane in an equilateral triangle shape, one side plane having an angle of 24.7° with the base plane among three side planes, remaining two side planes having an angle of 12.95° with the base plane, respectively, a height of 1 μm based on the base plane, a Young's modulus of 1140 GPa, and a Poisson's ratio of 0.07.

In one embodiment, a hardness of the first side and a hardness of the second side may be 35 GPa to 45 GPa, respectively.

In one embodiment, a crack occurrence dropping weight height of the silicon carbide wafer, measured by a DuPont impact tester with a weight of 25 g, may be 100 mm or more.

In one embodiment, the silicon carbide wafer may be a bare wafer, which does not include an epitaxial layer on its surface.

In one embodiment, the silicon carbide wafer may have a diameter of four inches or more and may include a 4H-silicon carbide.

In one embodiment, the silicon carbide wafer may include, a first side where a silicon atom layer is exposed on a surface of the first side and a second side where a carbon atom layer is exposed on a surface of the second side, and, when a nanoindentation test is performed, an indenter in a trigonal pyramid shape adds indentation to the silicon carbide wafer, and indentation quantity (x) depending on load (y) is regressed as $y=ax^2+bx+c$ type quadratic polynomial from beginning of indentation to 10 mN, where a may be 0.37 to 0.6, and b may be 10 to 33.

In one embodiment, a second reduced elastic modulus of the second side Ec and a first reduced elastic modulus of the first side Esi has a ratio Ec/Esi of 0.8 to 1.15.

In one embodiment, a second hardness of the second side Hc and a first hardness of the first side His has a ratio of Hc/His of 0.85 to 1.15.

In one embodiment, the first side may have the first reduced elastic modulus Esi of 300 GPa to 350 GPa.

In one embodiment, a hardness of the first side and a hardness of the second side may be 35 GPa to 45 GPa, respectively.

In one embodiment, the first side may have a micropipe density of $1/cm^2$ or less, a Threading Edge Dislocation (TED) density of $9000/cm^2$ or less, and a Basal Plane Dislocation (BPD) density of $4000/cm^2$ or less.

In one embodiment, the nanoindentation test has an average value of values measured at arbitrary ten points, except for a ring area occupying a width of 10 mm in a direction from an outermost edge to a center of the silicon carbide wafer.

In one embodiment, a crack occurrence dropping weight height of the silicon carbide wafer may be 100 mm or more measured by a DuPont impact tester with a weight of 25 g.

In one embodiment, the silicon carbide wafer may have a diameter of four inches or more and may include a 4H-silicon carbide.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
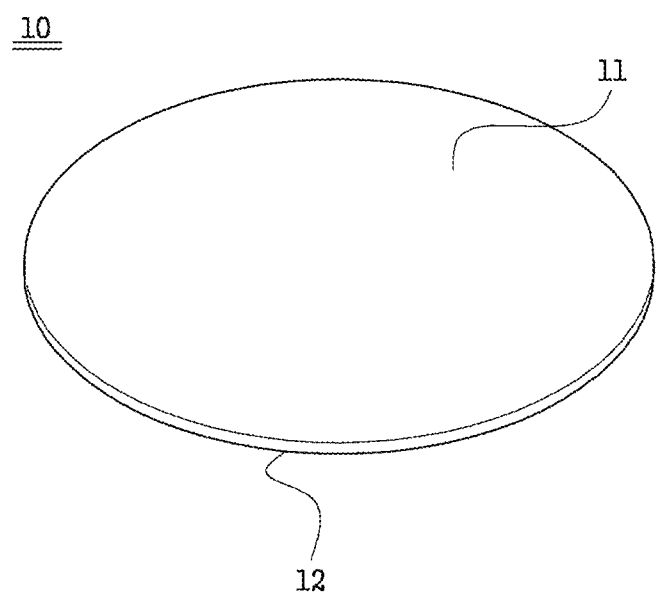
FIG. 1 is a conceptual view for showing one example of a silicon carbide wafer according to one embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

Throughout this disclosure, the phrase that a certain element "comprises" or "includes" another element means that the certain element may further include one or more other elements but does not preclude the presence or addition of one or more other elements, unless stated to the contrary.

Throughout this disclosure, it will be understood that when an element is referred to as being "connected" to another element, it can be directly connected to the other element or intervening elements may be present.

In this disclosure, "B being placed on A" means that B is placed in direct contact with A or placed over A with another layer or structure interposed therebetween and thus should not be interpreted as being limited to B being placed in direct contact with A, unless the description clearly dictates.

In this disclosure, the phrase "combination(s) thereof" included in a Markush-type expression denotes one or more mixtures or combinations selected from the group consisting of components stated in the Markush-type expression, that is, denotes that one or more components selected from the group consisting of the components are included.

In this disclosure, the description "A and/or B" means "A or B, or A and B."

In this disclosure, terms such as "first," "second," "A," or "B" are used to distinguish the same terms from each other. The singular forms "a," "an," and "the" include the plural form unless the context clearly dictates otherwise.

In this disclosure, a singular form is contextually interpreted as including a plural form as well as a singular form unless specially stated otherwise.

Hereinafter, example embodiments will be described in further detail.

An objective of example embodiments is to provide a silicon carbide ingot and a silicon carbide wafer having mechanical properties such as reduced elastic modulus, hardness, and mechanical property ratio of both sides, by controlling a flow quantity of an inert gas, and thermal properties of a reactor.

Another objective of example embodiments is to provide a silicon carbide ingot and a wafer having a reduced defect numerical value such as dislocation density and good quality.

Another objective of example embodiments is to minimize mechanical and thermal deformation when an epitaxial wafer and a device is manufactured through a wafer having the mechanical properties.

A silicon carbide wafer manufactured according to embodiments can minimize deformation due to external physical and thermal reasons, and provide a wafer having excellent properties. Also, a wafer, in which residual stress is more reduced, can be provided.

A manufacturing method according to embodiments can set an optimal process condition, and thereby can manufacture a silicon carbide ingot and a silicon carbide wafer, in which reduced elastic modulus and hardness characteristics are secured and a defect numerical value is reduced.

Silicon carbide ingot and wafer may have degraded mechanical properties depending on a process condition. Accordingly, there is a possibility of generating deformation and defects during processes of transport, processing, treatment, and the like of a wafer, and the quality of an epitaxial layer may be degraded due to thermal deformation and the like in a subsequent manufacturing process for a device.

While the inventors conducted research for manufacturing silicon carbide ingot and wafer improved in reduced elastic modulus and hardness characteristics and the thermal deformation, of which in a subsequent process, was minimized, the inventors verified that the flow quantity of an inert gas and the temperature gradient of a crucible are important among various factors for growing a silicon carbide ingot by applying Physical Vapor Transport (PVT), and silicon carbide ingot and wafer in a more excellent quality could be manufactured through control of such a condition, thereby completing the example embodiments.

Manufacturing Method for Silicon Carbide Ingot

Figure 2:
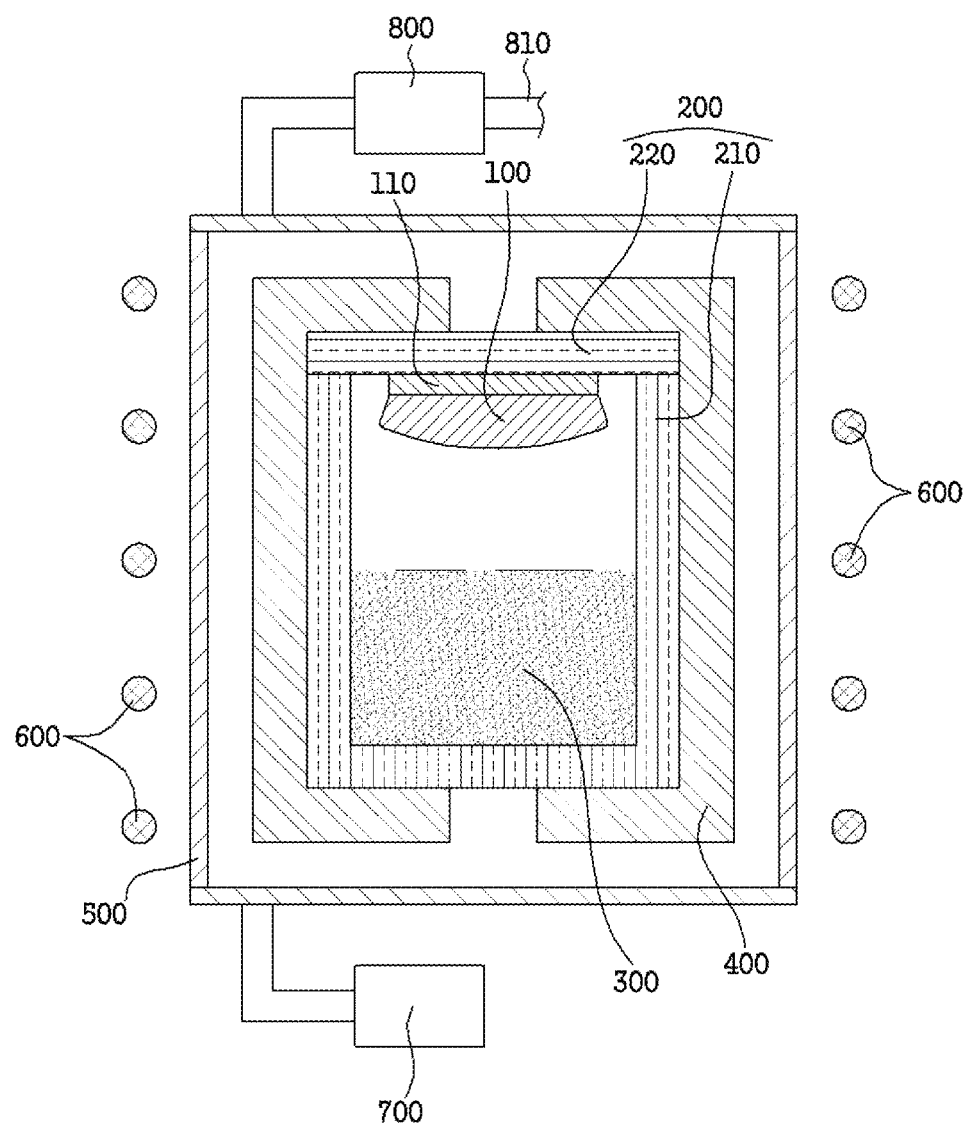
FIG. 2 is a conceptual view for showing one example of a device for preparing a silicon carbide ingot according to one embodiment.

Referring to FIG. 2, in one general aspect, a method of manufacturing a silicon carbide ingot according to embodiments includes, disposing a raw material 300 and a silicon carbide seed crystal 110 to be separate in a reactor 200 having an internal space; adjusting the temperature, pressure, and atmosphere of the internal space to sublimate the raw material 300 and growing a silicon carbide ingot 100 on the silicon carbide seed crystal 110; and cooling the reactor 200 and retrieving the silicon carbide ingot 100.

The adjusting may proceed in a first inert gas atmosphere having a flow quantity of 100 sccm to 300 sccm.

The cooling may proceed in a second inert gas atmosphere having a flow quantity of 1 sccm to 250 sccm.

The reactor 200 may have a thermal conductivity of 120 W/mK or less.

Referring to FIG. 1, the silicon carbide wafer 10 prepared by cutting the silicon carbide ingot 100 retrieved after the cooling and processing the silicon carbide ingot 100 by wrapping and surface polishing, may have a reduced elastic modulus of 300 GPa to 370 GPa and a hardness of 35 GPa to 48 GPa.

The reduced elastic modulus and hardness are measured according to a nanoindentation test, in which an indenter in a trigonal pyramid (Berkovich) shape is added in a load of 10 mN.

The manufacturing method for a silicon carbide ingot may proceed through a manufacturing device as illustrated in FIG. 2. Hereinafter, a manufacturing method for a silicon carbide ingot will be described with reference to FIG. 2.

The raw material 300 may be a powder form having carbon source and silicon source, and a raw material, in which the powder is necking treated or a silicon carbide powder, whose surface is carbonated, may be applied.

The reactor 200 may be any container suitable to grow a silicon carbide ingot, and specifically a graphite crucible may be applied. For example, the reactor 200 may include a body 210 including an internal space and an opening, and a cover 220 corresponding to the opening and sealing the internal space. The cover 220 may further include a seed crystal holder as one body or a separate one from the crucible cover, may fix a silicon carbide seed crystal 110 through the seed crystal holder, and thereby may allow a silicon carbide seed crystal 110 and a raw material 300 to face each other.

The reactor 200 may have a thermal conductivity of 120 W/mK or less, or 85 W/mK or more. When the thermal conductivity of the reactor 200 is less than 85 W/mK, the temperature gradient of the reactor 200 becomes excessive during growth of an ingot and a possibility of crack occurrence may be increased in the ingot, or a stress inside the ingot may be increased. When the thermal conductivity of the reactor 200 is more than 120 W/mK, a current is decreased during induction heating, a heat emitting temperature of the internal is also decreased, and a possibility of lowering an ingot growth rate may be generated, with a possibility of increasing impurities. For achieving mechanical properties desired by an ingot manufactured through subsequent steps, a reactor 200 having the above thermal conductivity range is applied to make a temperature gradient of the reactor 200 be stable.

The reactor 200 may be fixed by being surrounded by a heat insulating material 400, and the reactor 200 surrounded by the heat insulating material 400 may be held by a reacting chamber 500 like a quartz tube. The temperature of the internal space of the reactor 200 may be controlled by a heating means 600 equipped in the external of the heat insulating material 400 and the reacting chamber 500.

The heating means 600 may be an induction heating means in a coil shape. When an alternating current (AC) in a high frequency is supplied to the induction heating means 600, eddy current occurs in the reactor 200, and accordingly, an internal space of the reactor 200 may be heated by Joule's heat generated by resistance of the reactor 200.

The heat insulating material 400 may have a porosity of 72% to 95%, 75% to 93%, or 80% to 91%. When a heat insulating material 400 satisfying the above porosity is applied, crack occurrence of a growing silicon carbide ingot can be reduced more.

The heat insulating material 400 may have a compressive strength of 0.2 MPa or more, 0.48 MPa or more, or 0.8 MPa or more. Also, the heat insulating material 400 may have a compressive strength of 3 MPa or less, or 2.5 MPa or less. When the heat insulating material 400 has such a compressive strength, it is possible to manufacture a silicon carbide ingot in more excellent quality because of having excellent thermal/mechanical stability and lowered possibility of ash occurrence.

The heat insulating material 400 may have a thermal conductivity of 1.79 W/mK or less, or 1.24 W/mK or less at 2000° C. The thermal conductivity of the heat insulating material 400 at 2000° C. may be 0.3 W/mK or more, or 0.48 W/mK or more. Through the heat insulating material 400 having the above thermal conductivity range, it is possible to block heat emittance of the reactor 200 during growth of an ingot and simultaneously a stable temperature gradient of the reactor 200 can be formed.

The heat insulating material 400 may have a density of 0.13 g/cc or more, or 0.17 g/cc or more. The heat insulating material 400 may have a density of 0.28 g/cc or less, or 0.24 g/cc or less. Through the heat insulating material 400 having the above density range, it is possible to inhibit the bend and twist of a manufactured ingot.

The reacting chamber 500 may include a vacuum degassing device 700 connected to the internal of the reacting chamber 500 and adjusting vacuum degree inside the reactor 200, a pipe 810 connected to the internal of the reacting chamber 500 and guiding gas to flow into the internal of the reacting chamber 500, and a mass flow controller 800 controlling flow of gas. Through them, flow quantity of inert gas may be adjusted in subsequent growing and cooling.

The growth operation is an operation adjusting the temperature, pressure, and atmosphere of the internal space to sublimate the raw material 300 and grow a silicon carbide ingot 100 on the silicon carbide seed crystal 110.

The growth operation may be performed by heating the reactor 200 and the internal space of the reactor 200 by the heating unit 600, may depressurize the internal space at the same time with the heating or as a separate process to adjust the vacuum degree, and may induce growth of a silicon carbide ingot with injecting internal gas.

The growth operation may proceed in the condition of a temperature of 2000° C. to 2600° C. and a pressure of 1 torr to 200 torr, and it is possible to manufacture a silicon carbide ingot more efficiently in the above temperature and pressure range.

The growth operation may proceed, for example, in the condition of a temperature of 2100° C. to 2500° C. in upper and lower portions of the reactor 200 and a pressure of 1 torr to 50 torr in the internal space of the reactor 200, or in the condition of a temperature of 2150° C. to 2350° C. in upper and lower portions of the reactor 200 and a pressure of 1 torr to 30 torr in the internal space of the reactor 200. When the above temperature and pressure condition is applied to the growth step, it is possible to manufacture a silicon carbide ingot in a higher quality.

The growth operation may perform heating to the above temperature range in a heating rate of 1° C./min to 10° C./min, or 5° C./min to 10° C./min, and may include a pre-growth process having a relatively high heating rate and a growth proceeding process having a relatively low heating rate.

An inert gas may be added in the growth operation in a predetermined flow quantity to the internal of the reactor 200. For example, the inert gas may flow in a direction from the raw material 300 to the silicon carbide seed crystal 110. At this time, the growth operation may proceed in an inert gas atmosphere having a flow quantity of 100 sccm to 300 sccm, or 150 sccm to 250 sccm. If the flow quantity is less than 100 sccm, an amount of impurities may be increased due to decrease of a sublimating amount of the raw material, and if the flow quantity is more than 300 sccm, a growth speed of an ingot is excessively increased thereby generating a possibility of degradation of the ingot quality. The growth operation is required to proceed in the above flow quantity range, to form a stable temperature gradient of the reactor 200 and the internal space of the reactor 200, and to help sublimation of the raw material 300 to be easily made for achieving desired mechanical properties of an ingot.

The inert gas may be, for example, argon, helium, and a mixed gas thereof, and may include nitrogen in a small amount.

The cooling operation is an operation for cooling the grown silicon carbide ingot under the condition of predetermined cooling speed and flow quantity of an inert gas.

The cooling operation may perform cooling at a rate of 1° C./min to 10° C./min, or 3° C./min to 9° C./min. The cooling operation may perform cooling at a rate of 5° C./min to 8° C./min.

An inert gas may be added in the cooling operation in a predetermined flow quantity to the internal of the reactor 200 similar to the growth step. For example, the inert gas may flow in a direction from the raw material 300 to the silicon carbide seed crystal 110. At this time, the cooling operation may proceed in an inert gas atmosphere having a flow quantity of 1 sccm to 30 sccm, or 10 sccm to 250 sccm.

If the flow quantity is less than 1 sccm, cooling efficiency of an ingot is decreased and a temperature gradient of a reactor is excessive to have a possibility of increasing crack occurrence of an ingot and increasing a stress inside the ingot. If the flow quantity is more than 300 sccm, cooling speed is excessively increased to have a possibility of increasing crack occurrence of an ingot and increasing a stress inside the ingot. By performing a cooling operation in the flow quantity range, a stable temperature gradient of the reactor 200 and the internal space of the reactor 200 can be formed, and cooling of the silicon carbide ingot can be easily made to achieve desired mechanical properties.

A flow quantity of an inert gas in the growth operation (Fg) and a flow quantity of an inert gas in the cooling operation (Fc) may have a ratio Fg/Fc of 0.33 to 30, 0.6 to 25, or 0.6 to 6. By having such a flow quantity ratio, a slow variation of flow quantity can be made during growth and cooling processes, and the grown and cooled ingot can have desired mechanical properties.

During the cooling operation, the pressure adjustment may be made in the internal space of the reactor 200, or the pressure adjustment may be made separately from the cooling step. The pressure adjustment may be made to the internal space to have a pressure of 800 torr as the maximum.

The retrieving of the silicon carbide ingot may be performed by cutting the rear of the silicon carbide ingot in contact with the silicon carbide seed crystal 110. The silicon carbide ingot retrieved in this manner may be processed to be a form of a silicon carbide wafer through subsequent processes.

Manufacturing Method of Silicon Carbide Wafer 1

In one general aspect, a method of preparing a silicon carbide wafer according to example embodiments may include cutting the silicon carbide ingot manufactured according to the above to prepare a silicon carbide wafer. Also, the method may further include flattening the thickness of the silicon carbide wafer prepared through the cutting and polishing the surface thereof.

The silicon carbide ingot may be cut to have a predetermined off angle with (0001) surface of the silicon carbide ingot or a surface where growth is started. The off angle may be 0° to 10°.

The silicon carbide wafer may be cut to have a thickness of 150 μm to 900 μm, or 200 μm to 600 μm, but not be limited thereto.

Before the cutting step, the silicon carbide ingot may be processed by polishing the edge to have a diameter in a regular cylinder shape.

The silicon carbide wafer prepared after the cutting operation may have a damaged portion such as a trace of cutting and therefore a flattening process may be performed to remove this through subsequent steps.

The process of flattening the thickness may be performed by applying wheel grinding to both sides of the wafer, and may remove damage added in the cutting operation of the wafer to have an even thickness. The grinding wheel may be a form having particles embedded in the surface, and the particles embedded in the surface of the grinding wheel may be diamond or the like. The grinding wheel and a silicon carbide wafer may rotate in opposite directions from each other when the flattening process proceeds. A diameter of the grinding wheel may be larger than the diameter of the silicon carbide wafer.

The processing operation may further include wet etching of the wafer.

The processing operation may further include a chemical mechanical polishing step.

The chemical mechanical polishing may be performed by adding polishing particle slurry on a rotating surface plate and contacting a fixed silicon carbide wafer to the rotating polishing head in a predetermined pressure.

The silicon carbide wafer manufactured through the above manufacturing method has advantages of reduced defect density, a small number of impurity particles, and good mechanical properties according to a nanoindentation test described below.

Manufacturing Method of Silicon Carbide Wafer 2

In one general aspect, the method of preparing a silicon carbide wafer according to embodiments may include, disposing a raw material 300 and a silicon carbide seed crystal 110 to be separated in a reactor 200 having an internal space; adjusting the temperature, pressure, and atmosphere of the internal space for sublimating the raw material and growing a silicon carbide ingot 100 on the silicon carbide seed crystal 110; cooling the reactor and retrieving the silicon carbide ingot; and cutting the retrieved silicon carbide ingot to prepare a silicon carbide wafer, wherein the adjusting may proceed in a first inert gas atmosphere having a flow quantity of 100 sccm to 300 sccm, the cooling may proceed in a second inert gas atmosphere having a flow quantity of 1 sccm to 200 sccm, and the reactor may have a thermal conductivity of 125 W/mK or less.

The method of preparing the silicon carbide wafer may further include flattening the thickness of the silicon carbide wafer prepared through the cutting and polishing the surface.

In the method of preparing the silicon carbide wafer, the method of preparing a silicon carbide ingot may proceed through a manufacturing device as illustrated in FIG. 2.

The disposing, the adjusting, the cooling, the cutting, and the flattening may proceed as the same method as the method of preparing the silicon carbide wafer described above.

The reactor 200 may have a thermal conductivity of 125 W/mK or less, 85 W/mK or more. When the thermal conductivity of the reactor 200 is less than 85 W/mK, a temperature gradient of the reactor 200 during growth of an ingot may be excessive thereby increasing a probability of crack occurrence of the ingot and the stress inside the ingot may be increased. When the thermal conductivity of the reactor 200 is more than 125 W/mK, a current during induction heating may be decreased, an internal heat emitting temperature may also be decreased thereby generating a possibility of lowering a growth rate of an ingot, and impurities may be increased. It is required to apply a reactor 200 having the above thermal conductivity range, thereby a temperature gradient of the reactor 200 can be stably made, and the silicon carbide ingot and the silicon carbide wafer manufactured through subsequent steps can achieve desired mechanical properties.

The inert gas may be added during the adjusting in a predetermined flow quantity to the internal of the reactor 200. For example, the inert gas may flow in a direction from the raw material 300 to the silicon carbide seed crystal 110. At this time, the adjusting may proceed in an inert gas atmosphere having a flow quantity of 100 sccm to 300 sccm, or 150 sccm to 250 sccm. If the flow quantity is less than 100 sccm, there is a possibility of increasing an amount of impurities due to decrease of a sublimating amount of the raw material 300, and if the flow quantity is more than 300 sccm, a growth speed of an ingot is excessively increased thereby generating a possibility of degradation of the ingot quality. The adjusting is required to proceed in the above flow quantity range, to form a stable temperature gradient of the reactor 200 and the internal space of the reactor 200, and to help sublimation of the raw material 300 to be easily made for achieving desired mechanical properties of an ingot.

The inert gas may be, for example, argon, helium, and a mixed gas thereof, and may include nitrogen in a small amount.

The cooling is an operation for cooling the grown silicon carbide ingot under the condition of predetermined cooling speed and flow quantity of an inert gas.

The cooling operation may perform cooling at a rate of 1° C./min to 10° C./min, or 3° C./min to 9° C./min. The cooling operation may perform cooling at a rate of 5° C./min to 8° C./min.

The inert gas may be added during the cooling in a predetermined flow quantity to the internal of the reactor 200 as the same as the adjusting step. For example, the inert gas may flow in a direction from the raw material 300 to the silicon carbide seed crystal 110. At this time, the cooling may proceed in an inert gas atmosphere having a flow quantity of 1 sccm to 200 sccm, or 10 sccm to 200 sccm. If the flow quantity is less than 1 sccm, cooling efficiency of an ingot is decreased and a temperature gradient of a reactor 200 is excessive to have a possibility of increasing crack occurrence of an ingot and increasing a stress inside the ingot. If the flow quantity is more than 300 sccm, cooling speed is excessively increased to have a possibility of increasing crack occurrence of an ingot and increasing a stress inside the ingot. By performing the cooling in the flow quantity range, a stable temperature gradient of the reactor 200 and the internal space of the reactor 200 can be formed, and cooling of the silicon carbide ingot can be easily made to achieve desired mechanical properties.

A flow quantity of an inert gas in the adjusting, i.e., the growth operation (Fg) and a flow quantity of an inert gas in the cooling (Fc) may have a ratio Fg/Fc of 0.33 to 30, 0.6 to 25, or 0.6 to 6. By having such a flow quantity ratio, a slow variation of flow quantity can be made during growth and cooling processes, and the grown and cooled ingot can have desired mechanical properties.

Silicon Carbide Wafer (10) I

In one general aspect, the silicon carbide wafer according to embodiments has a reduced elastic modulus of 300 GPa to 370 GPa.

The silicon carbide wafer according to embodiments has a hardness of 35 GPa to 48 GPa.

The reduced elastic modulus and hardness are measured according to a nanoindentation test, in which an indenter in a trigonal pyramid (Berkovich) shape is added in a load of 10 mN.

Figure 3:
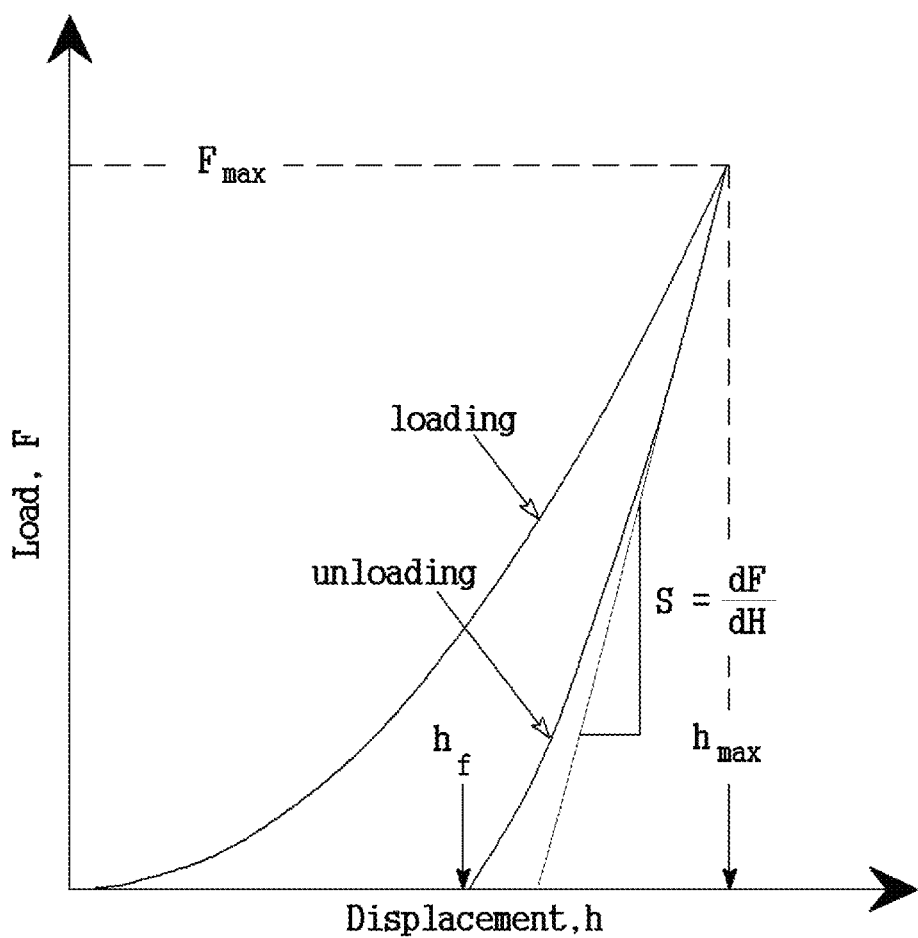
FIG. 3 is a graph for showing a load-dislocation curve and a gradient at a maximum load when indentation and unloading of an indenter are performed according to a nanoindentation test.

As one method for measuring mechanical properties of a wafer, a nanoindentation method may be applied. The nanoindentation can analyze mechanical properties of a target, through analysis of a threading depth of an indenter depending on variation of an applied load, when an indenter, which is an indenting means having a regular geometric shape, is unloaded after indentation of an indenter to the surface of the target. One example of a load-dislocation curve and a gradient at a maximum load according to a nanoindentation test is illustrated in FIG. 3. At this time, a range of applied load can be measured by μN to mN, a threading depth of an indenter can also be measured by nm to μm, and thereby various mechanical properties such as the hardness of a wafer, elastic modulus, residual stress, and the like can be more accurately measured. Nanoindentation test equipment used in embodiments may have an indentation depth of the indenter of 100 nm to 150 nm for measuring a reduced elastic modulus in the surface of a wafer, and the detailed items are described in below experimental example.

In the nanoindentation test, hardness (H) can be calculated according to a following equation.

$$H = F_{max}/A_p \quad \text{[Equation 1]}$$

In the Equation 1, H is a hardness, $F_{max}$ is a maximum load when the indenter is added to a target, and $A_p$ is a contacting area of an indenter and a target when the indenter adds a maximum load to a target.

In the nanoindentation test, a reduced elastic modulus (Er) can be calculated according to a following equation.

$$Er = \frac{\sqrt{\pi}}{2\beta} \times \frac{S}{\sqrt{Ap}} \quad \text{[Equation 2]}$$

In the Equation 2, Er is a reduced elastic modulus, β is a correction factor, S is a strong degree for showing a gradient value when an indenter is unloaded after the indenter reaches to a maximum load in a load-dislocation curve, and $A_p$ is a contacting area of an indenter and a target when the indenter adds a maximum load to a target.

The correction factor β may be generally 1 when an indenter is a cone shape in a symmetry type on an axis, 1.012 when an indenter is a quadrangular pyramid (Vickers) shape, or 1.034 when an indenter is a trigonal pyramid (Berkovich) shape, but is not limited thereto, and may be changed depending on a measuring device. Embodiments are based on the value measured through an indenter in a trigonal pyramid (Berkovich) shape.

Silicon carbide is a material having brittleness and hardness, the mechanical processing for manufacturing a silicon carbide wafer includes cutting (slicing), flattening (wrapping), and polishing, and such processes may proceed through diamond particles, grits, and the like. Silicon carbide ingot and wafer having not good mechanical properties may have problems such as break from brittleness and crack spread occurring in the surface during works such as processing, transport, and treatment. The silicon carbide wafer according to embodiments is controlled to have certain values of reduced elastic modulus and hardness according to a nanoindentation test, for minimizing the above problems.

The silicon carbide wafer 10 may have a reduced elastic modulus of 300 GPa to 370 GPa, or 320 GPa to 370 GPa according to the nanoindentation test.

The silicon carbide wafer 10 may have a hardness of 35 GPa to 48 GPa, or 40 GPa to 48 GPa according to the nanoindentation test.

The silicon carbide wafer 10 has the reduced elastic modulus and hardness values, thereby controlling deformation, which may occur due to external reasons, to be a proper level for minimizing a possibility of damage occurrence of a wafer and can decrease defect formation in subsequent processes.

Through the nanoindentation test, the mechanical properties can be obtained under the condition of adding an indenter in a trigonal pyramid (Berkovich) shape to an arbitrary area on the surface of the silicon carbide wafer in a load of 10 mN. For example, the trigonal pyramid indenter may have a height of 1 μm, a base plane in an equilateral triangle shape, one side plane having an angle of 24.7° with the base plane among three side planes, and remaining two side planes having an angle of 12.95° with the base plane. Also, arbitrary ten points may be measured on the surface of the silicon carbide wafer, through the average value the mechanical properties can be obtained, the arbitrary ten points may be measured except for a ring region occupying a width of 10 mm in a direction from the outermost edge to the center of the silicon carbide wafer 10, and through the average value the mechanical properties can be obtained.

A standard deviation of the reduced elastic modulus of the silicon carbide wafer 10 may be 5.5 GPa or less, 5 GPa or less, or 4 GPa or less according to the nanoindentation test. The standard deviation of the reduced elastic modulus may be 0.1 GPa or more, or 0.2 GPa or more.

A standard deviation of the hardness of the silicon carbide wafer 10 may be 1.1 GPa or less, or 0.8 GPa or less according to the nanoindentation test. The standard deviation of the harness may be 0.1 GPa or more, or 0.2 GPa or more.

The standard deviation of reduced elastic modulus and hardness according to the nanoindentation test, may be calculated by measuring arbitrary ten points except for a ring region occupying a width of 10 mm in a direction from the outermost edge to the center of the silicon carbide wafer 10.

The silicon carbide wafer 10 has a range of the standard deviation of reduced elastic modulus and hardness according to such a nanoindentation test, thereby showing even mechanical properties over all regions of the wafer, and defect occurrence can be minimized in a subsequent process for processing the wafer and a process for forming an epitaxial layer.

The silicon carbide wafer 10 may include a 4H-silicon carbide structure. The silicon carbide wafer 10 may include a Si surface as a first side, where a silicon atom layer is exposed on the surface of the first side; and a C surface as a second side, where a carbon atom layer is exposed on the surface of the second side.

In the silicon carbide ingot, a bonding strength between a layer, where carbon atoms are arranged, and a layer, where silicon atoms are arranged, is weaker than the bonding strength of other portions, and therefore it may be easily cut in a direction parallel to a certain plane. Accordingly, the silicon carbide ingot may be easily cut in a direction parallel to a certain plane, which is the border of a carbon atom layer and a silicon atom layer, and the carbon atom layer and the silicon atom layer are exposed on the cut section.

This is the same even after polishing is performed, accordingly in the silicon carbide wafer, the first side may be so called Si surface, where a silicon atom layer is exposed, and the second side may be so called C surface, where a carbon atom layer is exposed.

In the C surface of the silicon carbide wafer 10, a reduced elastic modulus according to the nanoindentation test may be 330 GPa to 370 GPa, or 340 GPa to 370 GPa.

In the C surface of the silicon carbide wafer 10, a hardness according to the nanoindentation test may be 38 GPa to 48 GPa, or 40 GPa to 48 GPa.

In the C surface of the silicon carbide wafer 10, the standard deviation of the reduced elastic modulus according to the nanoindentation test may be 5.5 GPa or less, 5 GPa or less, or 4 GPa or less. The standard deviation of the reduced elastic modulus may be 0.1 GPa or more, or 0.2 GPa or more.

In the C surface of the silicon carbide wafer 10, the standard deviation of the hardness according to the nanoindentation test may be 1.1 GPa or less, or 0.8 GPa or less. The standard deviation of the hardness may be 0.1 GPa or more, or 0.2 GPa or more.

The silicon carbide wafer 10 has the above mechanical properties, and thereby adjusts the degree of deformation, which can be generated by external strength, to be suitable, for satisfying durability and processability.

The silicon carbide wafer 10 may have a micropipe (MP) density of $1/cm^2$ or less, or $0.8/cm^2$ or less.

The silicon carbide wafer 10 may have a Threading Edge Dislocation (TED) density of $9000/cm^2$ or less, or $7500/cm^2$ or less.

The silicon carbide wafer 10 may have a Basal Plane Dislocation (BPD) density of $3000/cm^2$ or less, or $2760/cm^2$ or less.

The silicon carbide wafer 10 may have a thickness of 100 μm to 600 μm, but any suitable thickness for a semiconductor device may be applied and not limited thereto.

The silicon carbide wafer 10 satisfies the above defect density range, thereby providing a wafer having reduced defects and a good quality, and when applying the wafer to a device, it is possible to manufacture a device having excellent electrical or optical properties.

The defect density of the silicon carbide wafer 10 can be measured by adding an etching solution and filming the surface, and the detailed items were described in below experimental examples.

The silicon carbide wafer 10 may have a diameter of four inches or more, five inches or more, or six inches or more. Also, the silicon carbide wafer may have a diameter of twelve inches or less, or ten inches or less.

The silicon carbide wafer 10 may have a minimum value of mechanical energy of 0.194 J to 0.475 J per unit area ($cm^2$), when a crack is generated by the mechanical energy added to the surface.

The silicon carbide wafer 10 may have a minimum value of mechanical energy of 0.194 J or more per unit area ($cm^2$), or 0.233 J or more per unit area ($cm^2$). The mechanical energy may be 0.475 J or less per unit area ($cm^2$), or 0.467 J or less per unit area ($cm^2$). When a crack is generated due to mechanical energy added to the surface of a silicon carbide wafer, the silicon carbide wafer having a minimum value of mechanical energy in the above range can minimize damage or defect occurrence during transport, processing, treatment, and the like of a wafer, and can show a good quality in a process of forming a silicon carbide epitaxial layer, which is a subsequent process for manufacturing a device.

Crack occurrence from mechanical energy in the silicon carbide wafer 10 means that, when the mechanical energy is added to the surface of the silicon carbide wafer, the wafer is not divided into two or more, a crevice in a width of 0.001 mm does not occur in the wafer, and the wafer is not broken into fragments. The mechanical energy may be corresponding to energy when potential energy, kinetic energy, and the like against an external impact source are added to the silicon carbide wafer or may be kinetic energy of the impact source when the impact source reaches to the silicon carbide wafer.

An area where mechanical energy is added to the surface may be 100 $mm^2$ or less, 50 $mm^2$ or less, or 25 $mm^2$ or less. An area where mechanical energy is added to the surface may be 10 $mm^2$ or more.

The silicon carbide wafer 10 may be one not generating a crack when a DuPont impact test, which is dropping an impactor having a weight of 25 g to a sample in a thickness of about 360 μm at a height of about 100 mm to 200 mm and about 25° C. according to ASTM D 2794.

The silicon carbide wafer may be one not generating a crack when a DuPont impact test, which is dropping an impactor having a weight of 30 g to a sample in a thickness of about 360 μm at a height of about 100 mm to 200 mm and about 25° C. according to ASTM D 2794. The impactor may be one having a diameter of about 4 mm.

When the silicon carbide wafer 10 generates a crack due to mechanical energy added to the surface, impact resistance, which shows a minimum value of the mechanical energy, can be measured through a test of dropping an impactor having a weight to the silicon carbide wafer.

A silicon carbide wafer not showing a crack in the result according to such a DuPont impact test can minimize damage and defect occurrence during transport, processing, treatment, and the like of the wafer, and can show a good quality in a process of forming a silicon carbide epitaxial layer, which is a subsequent process for manufacturing a device.

The silicon carbide wafer 10 may correspond to so called bare wafer, which is one before an epitaxial growth on the surface.

Silicon Carbide Wafer (10) II

In addition, a silicon carbide wafer 10 according to embodiments, includes a first side where more silicon atoms are exposed on a surface of the first side than carbon atoms and a second side where more carbon atoms are exposed on a surface of the second side than silicon atoms, wherein a second reduced elastic modulus of the second side Ec and a first reduced elastic modulus of the first side Esi have a ratio Ec/Esi of 0.8 to 1.15, a second hardness of the second side Hc and a first hardness of the first side Hsi of the silicon carbide wafer 10 have a ratio Hc/Hsi of 0.85 to 1.15, and the first reduced elastic modulus of the first side, the second reduced elastic modulus of the second side, the first hardness of the first side, and the second hardness of the second side are measured according to a nanoindentation test, in which an indenter in a trigonal pyramid shape is added in a load of 10 mN.

The silicon carbide wafer 10 may have a ratio Ec/Esi of 0.8 to 1.15, 0.9 to 1.1, or 1.04 to 1.06, which is a ratio of the reduced elastic modulus of the second side 12 Ec and the reduced elastic modulus of the first side 11 Esi according to the nanoindentation test.

The silicon carbide wafer 10 may have a ratio Hc/Hsi of 0.85 to 1.15, 0.9 to 1.12, or 1.01 to 1.1, which is a ratio of the hardness of the second side 12 Hc and a hardness of the first side 11 Hsi according to the nanoindentation test.

The silicon carbide wafer 10 has the Ec/Esi and Hc/His ratios, thereby controlling deformation of both sides, which can occur due to external reasons, to be a suitable level for minimizing a possibility of damage occurrence and can decrease defect formation in subsequent processes.

The silicon carbide wafer 10 may have a reduced elastic modulus of the first side 11 Esi of 300 GPa to 350 GPa, 304 GPa to 331 GPa, or 307 GPa to 326 GPa according to the nanoindentation test.

The silicon carbide wafer 10 may have a reduced elastic modulus of the second side 12 Ec of 310 GPa to 370 GPa, 320 GPa to 350 GPa, or 326 GPa to 339 GPa according to the nanoindentation test.

The silicon carbide wafer 10 may have a hardness of the first side 11 or the second side 12 of 35 GPa to 45 GPa, or 37.1 GPa to 41.5 GPa according to the nanoindentation test.

The standard deviation of the reduced elastic modulus of the first side 11 or the second side 12 of the silicon carbide wafer 10 may be 5.5 GPa or less, 5 GPa or less, or 4 GPa or less. The standard deviation of the reduced elastic modulus may be 0.1 GPa or more, or 0.2 GPa or more.

The standard deviation of the hardness of the first side 11 or the second side 12 of the silicon carbide wafer 10 may be 1.1 GPa or less, or 0.8 GPa or less. The standard deviation of the hardness may be 0.1 GPa or more, or 0.2 GPa or more.

The standard deviation of the reduced elastic modulus and hardness according to the nanoindentation test may be measured by measuring arbitrary ten points in an internal region 15, except for a ring region 14 occupying a width of 10 mm in a direction from the outermost edge to the center of the silicon carbide wafer 10.

The silicon carbide wafer 10 may have a micropipe (MP) density of 1/cm$^2$ or less, or 0.8/cm$^2$ or less.

The silicon carbide wafer 10 may have a Threading Edge Dislocation (TED) density of 9000/cm$^2$ or less, or 8000/cm$^2$ or less.

The silicon carbide wafer 10 may have a Basal Plane Dislocation (BPD) density of 4000/cm$^2$ or less, or 3000/cm$^2$ or less.

The silicon carbide wafer 10 may have a thickness of 100 μm to 600 μm, but any suitable thickness for a semiconductor device may be applied and not limited thereto.

The silicon carbide wafer 10 satisfies the above defect density range, thereby providing a wafer having reduced defects and a good quality, and when applying the wafer to a device, it is possible to manufacture a device excellent in electrical or optical properties.

The defect density of the silicon carbide wafer 10 can be measured by adding an etching solution and filming the surface, and the detailed items were described in below experimental examples.

The silicon carbide wafer 10 may have a diameter of four inches or more, five inches or more, or six inches or more. Also, the silicon carbide wafer may have a diameter of twelve inches or less, or ten inches or less.

The silicon carbide wafer 10 may have a minimum value of mechanical energy of 0.194 J to 0.475 J per unit area (cm$^2$), when a crack is generated by a mechanical energy added to the surface of the silicon carbide wafer 10.

The silicon carbide wafer 10 may have a minimum value of mechanical energy of 0.194 J or more per unit area (cm$^2$), or 0.233 J or more per unit area (cm$^2$). The mechanical energy may be 0.475 J or less per unit area (cm$^2$), or 0.467 J or less per unit area (cm$^2$). When a crack is generated due to mechanical energy added to the surface of a silicon carbide wafer, the silicon carbide wafer having a minimum value of mechanical energy in the above range can minimize damage or defect occurrence during transport, processing, treatment, and the like of a wafer, and can show a good quality in a process of forming a silicon carbide epitaxial layer, which is a subsequent process for manufacturing a device.

An area where mechanical energy is added to the surface may be 100 mm$^2$ or less, 50 mm$^2$ or less, or 25 mm$^2$ or less. An area where mechanical energy is added to the surface may be 10 mm$^2$ or more.

The silicon carbide wafer may be one not generating a crack when a DuPont impact test, which is dropping an impactor having a weight of 25 g to a sample having a thickness of about 360 μm at a height of about 100 mm to 200 mm and about 25° C. according to ASTM D 2794.

The silicon carbide wafer may be one not generating a crack when a DuPont impact test, which is dropping an impactor having a weight of 30 g to a sample having a thickness of about 360 μm at a height of about 100 mm to 200 mm and about 25° C. according to ASTM D 2794. The impactor may be one having a diameter of about 4 mm.

When the silicon carbide wafer generates a crack due to mechanical energy added to the surface, impact resistance, which shows a minimum value of the mechanical energy, can be measured through a test of dropping an impactor having a weight to the silicon carbide wafer.

A silicon carbide wafer not showing a crack in the result according to such a DuPont impact test can minimize damage and defect occurrence during transport, processing, treatment, and the like of the wafer, and can show a good quality in a process of forming a silicon carbide epitaxial layer, which is a subsequent process for manufacturing a device.

The silicon carbide wafer 10 may correspond to so called bare wafer, which is one before proceeding of epitaxial growth on the surface.

Other characteristics of the silicon carbide 10 may be the same as described in the Silicon Carbide Wafer I.

Silicon Carbide Wafer (10) III

In addition, a silicon carbide wafer 10 according to embodiments may include, a first side where a silicon atom layer is exposed on a surface of the first side and a second side where a carbon atom layer is exposed on a surface of the second side, and when a nanoindentation test is performed, an indenter in a trigonal pyramid shape adds indentation to the silicon carbide wafer, and indentation quantity (x) depending on load (y) is regressed as $y=ax^2+bx+c$ type quadratic polynomial from beginning of indentation to 10 mN, wherein a may be 0.37 to 0.6, and b may be 10 to 33.

Silicon carbide is a material having brittleness and hardness, the mechanical processing for manufacturing a silicon carbide wafer includes cutting (slicing), flattening (wrapping), and polishing, and such a processing may proceed through diamond particles, grits, and the like. Silicon carbide ingot and wafer having not good mechanical properties may have problems such as break from brittleness and crack spread occurring on the surface during works such as processing, transport, and treatment. The silicon carbide wafer according to embodiments is controlled to have certain ranges of respective coefficients of a quadratic polynomial obtained by regressing a load-indentation distribution formed according to a nanoindentation test, for minimizing the above problems.

Regression is an analyzing method of measuring a goodness-of-fit after finding a model between two variables, with respect to observed continuous variables. For example, when there is an input data set {(x,y)}k={(x1,y1), (x2,y2), (x3,y3), . . . (xN,yN)} or the like and this data relation tendency is supposed to be nonlinear and substantially similar to a polynomial, polynomial regression analysis for finding a coefficient minimizing an error between data and the polynomial may be applied. In embodiments, indentation quantity (x) depending on a load (y) when indentation of an indenter in a trigonal pyramid shape proceeds from beginning to 10 mN is regressed to a quadratic polynomial, which is considered to be the most suitable, according to a nanoindentation test, and thereby mechanical properties related to minute impact, a scratch, or the like, which may occur in actual processing for a silicon carbide wafer and subsequent processes, can be understood in further detail.

The silicon carbide wafer 10 may have a quadratic polynomial regressed from indentation of an indenter in a trigonal pyramid shape added to a silicon carbide wafer, when a nanoindentation test is performed, indentation quantity (x) depending on load (y) is regressed as $y=ax^2+bx+c$ type quadratic polynomial from beginning of indentation to 10 mN, wherein a may be 0.37 to 0.6, or 0.45 to 0.56, b may be 10 to 33, or 16 to 24, and c may be −200 to 5.

For example, in the first side 11 of the silicon carbide wafer, a of the quadratic polynomial according to the nanoindentation test may be 0.45 to 0.56, and b may be 10 to 24. Also, in the second side 12 of the silicon carbide wafer, a of the quadratic polynomial according to the nanoindentation test may be 0.37 to 0.50, and b may be 16 to 26.

A silicon carbide wafer having the above a and b values can decrease the occurrence of scratches, defects, and the like, and can make device manufacture be easier through subsequent processes.

The silicon carbide wafer 10 may have a ratio Ec/Esi of 0.8 to 1.15, 0.9 to 1.1, or 1.04 to 1.06, which is a ratio of a reduced elastic modulus of the second side 12 Ec and a reduced elastic modulus of the first side 11 Esi.

The silicon carbide wafer 10 may have a ratio Hc/Hsi of 0.85 to 1.15, 0.9 to 1.12, or 1.01 to 1.1, which is a ratio of a hardness of the second side 12 Hc and a hardness of the first side 11 Hsi.

The silicon carbide wafer 10 has the above Ec/Esi and Hc/Hsi ratios, thereby controlling deformation, which may occur due to external reasons, to be a proper level, for minimizing a possibility of damage occurrence of a wafer and can decrease defect formation in subsequent processes.

The silicon carbide wafer 10 may have a reduced elastic modulus of the first side 11 Esi of 300 GPa to 350 GPa, 304 GPa to 331 GPa, or 307 GPa to 326 GPa according to the nanoindentation test.

The silicon carbide wafer 10 may have a reduced elastic modulus of the second side 12 Ec of 310 GPa to 370 Gpa, 320 GPa to 350 GPa, or 326 GPa to 339 GPa.

The silicon carbide wafer 10 may have a hardness of the first side 11 or the second side 12 of 35 GPa to 45 GPa, or 37.1 GPa to 41.5 GPa according to the nanoindentation test.

The standard deviation of the reduced elastic modulus of the first side 11 or the second side 12 of the silicon carbide wafer 10 may be 5.5 GPa or less, 5 GPa or less, or 4 GPa or less. The standard deviation of the reduced elastic modulus may be 0.1 GPa or more, or 0.2 GPa or more.

The standard deviation of the hardness of the first side 11 or the second side 12 of the silicon carbide wafer 10 may be 1.1 GPa or less, or 0.8 GPa or less. The standard deviation of the hardness may be 0.1 GPa or more, or 0.2 GPa or more.

The standard deviation of the reduced elastic modulus and the hardness according to the nanoindentation test can be calculated by measuring arbitrary ten points in the internal region 15, except for a ring region 14 occupying a width of 10 mm in a direction from the outermost edge to the center of the silicon carbide wafer 10.

Figure 5A:
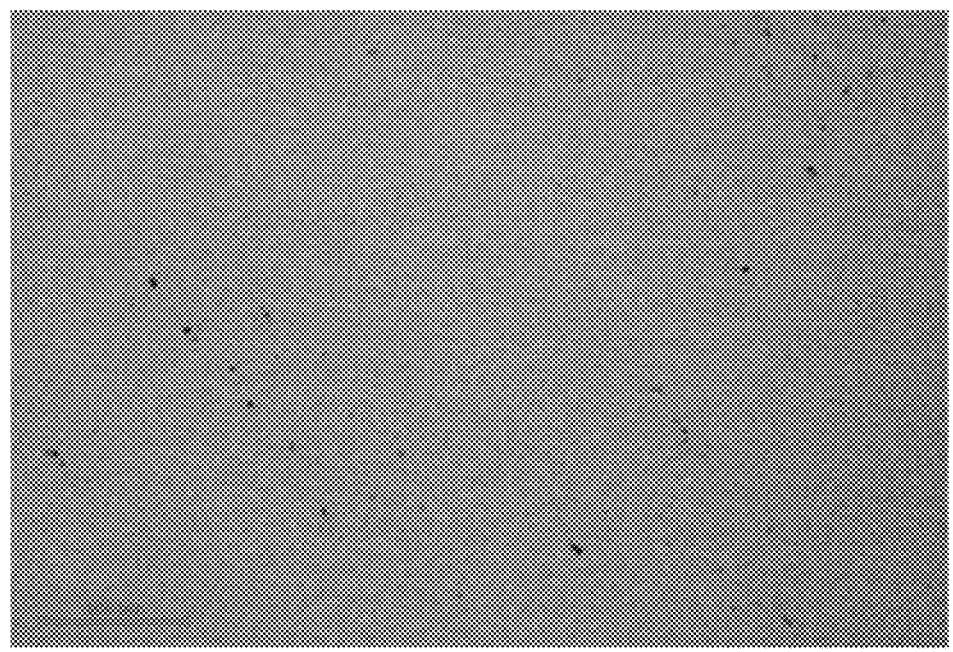
FIGS. 5A and 5B are pictures taken through an electric microscope for showing C surface (5A) and Si surface (5B) of the silicon carbide wafer in the tenth measurement of Example 2.
Figure 5B:
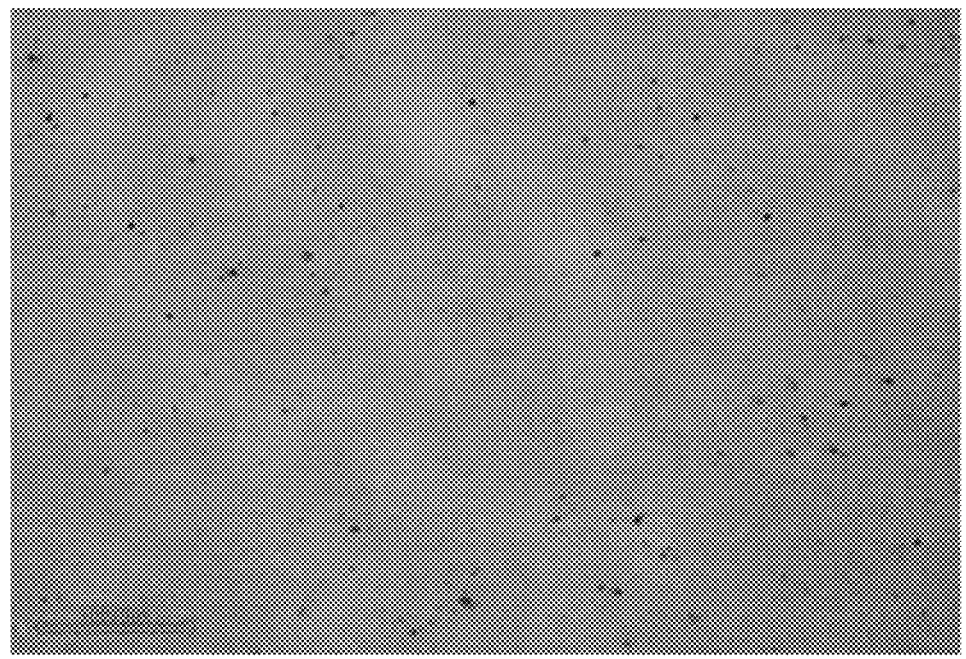

For example, the nanoindentation test may derive the mechanical properties under the condition, in which an indenter in a trigonal pyramid (Berkovich) shape is added to an arbitrary region of the surface of the silicon carbide wafer in a load of 10 mN. The indenter in a trigonal pyramid shape may include a diamond in a portion for contacting to a measuring target, and may have a height of 1 μm, a base plane in an equilateral triangle shape, one side plane having an angle of 24.7° with the base plane among three side planes, and remaining two side planes having an angle of 12.95° with the base plane, respectively. Additionally, arbitrary ten points on the surface of the silicon carbide wafer is measured and through the average value thereof, the mechanical properties can be obtained, and arbitrary ten points are measured in the internal region 15 of the first side and the second side, respectively, except for a ring region 14 occupying a width of 10 mm in a direction from the outermost edge to the center of the silicon carbide wafer 10 as illustrated in FIG. 5, and through the average value thereof the mechanical properties can be obtained.

The silicon carbide wafer 10 has reduced elastic modulus and hardness values and proper standard deviation ranges according to such a nanoindentation test, thereby showing even mechanical properties over all regions of the wafer, and defect occurrence can be minimized in a process of forming an epitaxial layer.

The silicon carbide wafer 10 may have a micropipe (MP) density of 1/cm² or less, or 0.8/cm² or less.

The silicon carbide wafer 10 may have a Threading Edge Dislocation (TED) density of 9000/cm² or less, or 8000/cm² or less.

The silicon carbide wafer 10 may have a Basal Plane Dislocation (BPD) density of 4000/cm² or less, or 3000/cm² or less.

The silicon carbide wafer 10 may have a thickness of 100 μm to 600 μm, but any suitable thickness for a semiconductor device may be applied and not limited thereto.

The silicon carbide wafer 10 satisfies the above defect density range, thereby providing a wafer having reduced defects and a good quality, and when applying the wafer to a device, it is possible to manufacture a device excellent in electrical or optical properties.

The defect density of the silicon carbide wafer 10 can be measured by adding an etching solution and filming the surface, and the detailed items were described in below experimental examples.

The silicon carbide wafer 10 may have a diameter of four inches or more, five inches or more, or six inches or more. Also, the silicon carbide wafer may have a diameter of twelve inches or less, or ten inches or less.

The silicon carbide wafer 10 may have a minimum value of mechanical energy of 0.194 J to 0.475 J per unit area (cm²), when a crack is generated by the mechanical energy added to the surface.

The silicon carbide wafer 10 may have a minimum value of mechanical energy of 0.194 J or more per unit area (cm²), or 0.233 J or more per unit area (cm²). The mechanical energy may be 0.475 J or less per unit area (cm²), or 0.467 J or less per unit area (cm²). When a crack is generated due to mechanical energy added to the surface of a silicon carbide wafer, the silicon carbide wafer having a minimum value of mechanical energy in the above range can minimize damage or defect occurrence during transport, processing, treatment, and the like of a wafer, and can show a good quality in a process of forming a silicon carbide epitaxial layer, which is a subsequent process for manufacturing a device.

An area where mechanical energy is added to the surface may be 100 mm² or less, 50 mm² or less, or 25 mm² or less. An area where mechanical energy is added to the surface may be 10 mm² or more.

The silicon carbide wafer may be one not generating a crack when a DuPont impact test, which is dropping an impactor having a weight of 25 g to a sample having a thickness of about 360 μm at a height of about 100 mm to 200 mm and about 25° C. according to ASTM D 2794.

The silicon carbide wafer may be one not generating a crack when a DuPont impact test, which is dropping an impactor having a weight of 30 g to a sample having a thickness of about 360 μm at a height of about 100 mm to 200 mm and about 25° C. according to ASTM D 2794. The impactor may be one having a diameter of about 4 mm.

When the silicon carbide wafer generates a crack due to mechanical energy added to the surface, impact resistance, which shows a minimum value of the mechanical energy, can be measured through a test of dropping an impactor having a weight to the silicon carbide wafer.

A silicon carbide wafer not showing a crack in the result according to such a DuPont impact test can minimize damage and defect occurrence during transport, processing, treatment, and the like of the wafer, and can show a good quality in a process of forming a silicon carbide epitaxial layer, which is a subsequent process for manufacturing a device.

The silicon carbide wafer 10 may correspond to so called bare wafer, which is one before proceeding of epitaxial growth on the surface of the silicon carbide wafer 10.

Other characteristics of the silicon carbide wafer 10 may be the same as described in the Silicon Carbide Wafer I.

Semiconductor Device 1

In one general aspect, a semiconductor device 1 according to embodiments may include, a silicon carbide wafer 10 according to the above; an epitaxial layer 20 disposed on a first side of the silicon carbide wafer; a barrier area 30 disposed on the epitaxial layer therebetween, a source electrode 41 disposed in contact with the epitaxial layer; a gate electrode 42 disposed on the barrier area; and a drain electrode 43 disposed on a second side of the silicon carbide wafer.

Figure 7:
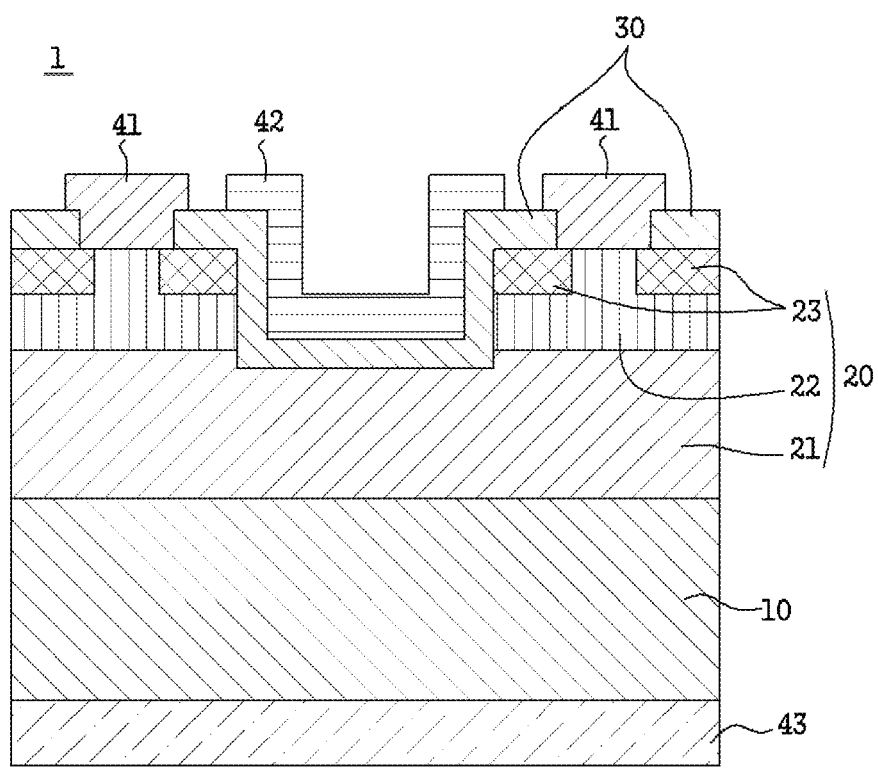
FIG. 7 is a schematic view for showing one example of a semiconductor device including the silicon carbide wafer according to embodiments.

One example of the semiconductor device 1 was shown in FIG. 7.

The silicon carbide wafer 10 may be any one among wafers described in the Silicon Carbide Wafers I to III.

The silicon carbide wafer 10 may include an n⁺ type silicon carbide.

Here, superscript + and − sign is for relatively showing a carrier density, for example, n⁺ refers to an n type semiconductor strongly doped to have a high dopant density, and p⁻ refers to a p type semiconductor very weakly doped to have a relatively low dopant density.

An epitaxial layer 20 on the silicon carbide wafer 10 may be composed of a silicon carbide single crystal layer, whose lattice constant gap with the silicon carbide wafer is small or few.

The epitaxial layer 20 may be formed by Chemical Vapor Deposition (CVD) process and the like.

The epitaxial layer 20 may include an n⁻ type epitaxial layer 21 disposed on the n⁺ type silicon carbide wafer 10; and a p⁺ type epitaxial layer 22 disposed on the n⁻ type epitaxial layer.

The p⁺ type epitaxial layer applies selective ion injection to an upper portion, and thereby an n⁺ type area 23 may be formed.

In the center of the semiconductor device 1, a barrier area 30 in a trench structure cut to an n− type epitaxial layer 21, and a gate electrode 42 on the barrier area 30 in a trench structure may be disposed.

The semiconductor device 1 may include the silicon carbide wafer 10 manufactured according to the manufacturing method for silicon carbide ingot and wafer, thereby decreasing device defects.

Hereinafter, while embodiments of the present disclosure will be described in more detail with reference to the accompanying examples, it is noted that examples are not limited to the same.

Example—Manufacture of Silicon Carbide Ingot

As one example of a manufacturing device for a silicon carbide ingot illustrated in FIG. 1, a silicon carbide powder as a raw material 300 was charged in a lower portion of the internal space of a reactor 200, and a silicon carbide seed crystal 110 was disposed in an upper portion thereof. At this time, the silicon carbide seed crystal 110 was one composed of a 4H-silicon carbide crystal in six inches and was fixed by an ordinary method to have C surface ((000-1) surface) facing to the silicon carbide raw material 300 in a lower portion of the internal space, and the reactor 200 was one having a thermal conductivity of Example in below Table 1.

A reactor 200 was sealed, the external thereof was surrounded by a heat insulating material 400, and thereafter the reactor 200 was disposed inside a quartz tube 500 having a heating coil as a heating means 600 equipped in the external. The internal space of the reactor 200 was depressurized to a vacuum atmosphere, argon gas was injected to the internal space to reach 760 torr, and after that, the internal space was depressurized again. Simultaneously, the temperature of the internal space was increased to 2300° C. in a heating rate of 5° C./min, and the flow quantity of argon gas inside a quartz tube was adjusted to be a flow quantity of Example in below Table 1 through a pipe 810 and a vacuum degassing device 700 connected to the quartz tube. A silicon carbide ingot 100 was grown on a surface of a silicon carbide seed crystal 110 opposite to a silicon carbide raw material 300 for 100 hours, under the condition of a temperature of 2300° C. and a pressure of 20 torr.

After growth, the internal space was cooled to have a temperature of 25° C. at a rate of 5° C./min, simultaneously the pressure of the internal space was adjusted to be 760 torr, and a silicon carbide ingot was retrieved. At this time, the flow quantity of argon gas inside a quartz tube was adjusted to be a flow quantity of Example in below Table 1 through a pipe 810 and a vacuum degassing device connected to the quartz tube.

Comparative Example—Manufacture of Silicon Carbide Ingot

In the manufacture of a silicon carbide ingot of the Example, the reactor 200 having a thermal conductivity of Comparative Example in below Table 1 was applied, and the flow quantity condition of an inert gas during growing or cooling was adjusted to be a flow quantity of Comparative Example in below Table 1. Except for the above, the Comparative Example was performed same as the Example.

Example and Comparative Example—Manufacture of Silicon Carbide Wafer

In the manufacture of a silicon carbide ingot of Example and Comparative Example, a circumference surface of a cooled silicon carbide ingot was ground to have an outer diameter of 95% compared to a maximum diameter, processed into a circumference shape having a regular outer diameter, and cut to have an off angle of 4° with (0001) surface of the silicon carbide ingot, thereby manufacturing a silicon carbide wafer having a thickness of 360 μm. Subsequently, the silicon carbide wafer was ground through a diamond wheel to flatten the thickness, and after that, treated by chemical mechanical polishing through silica slurry. An outer ring region occupying a width of 10 mm in a direction from the outermost edge to the center of the polished silicon carbide wafer sample was excluded, arbitrary five points within the internal region were cut to a size of 10 mm×10 mm, and thereby the silicon carbide wafer sample was prepared.

Experimental Example—Measurement of Defect Density of Silicon Carbide Wafer

Figure 4:
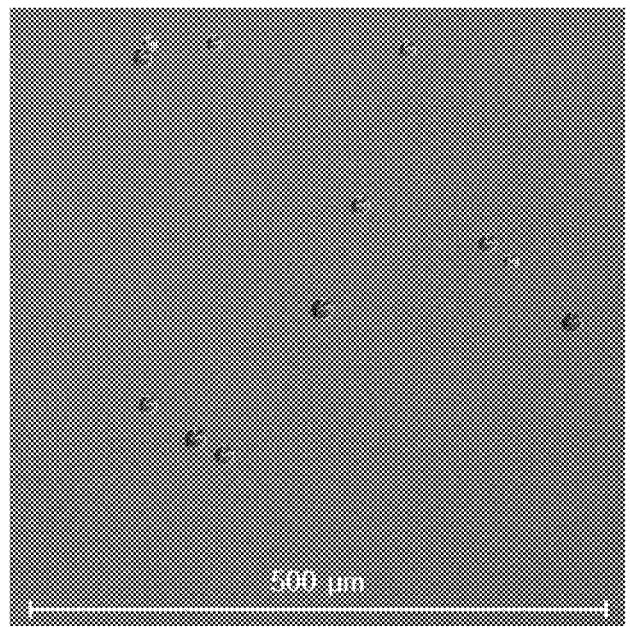
FIG. 4 is a picture taken through an electric microscope for examples of defect forms when defect is measured in experimental examples.

The silicon carbide wafer sample prepared in the Example and Comparative Example was digested in molten potassium hydroxide (KOH) under the condition of 500° C. and 5 minutes to be treated by etching, and defects in the surface thereof were filmed through an electric microscope or the like as illustrated in FIG. 4. A shell shaped pit was classified into Basal Plane Dislocation (BPD), a small hexagon pit was classified into Threading Edge Dislocation (TED), and a huge black hexagon pit was classified into micropipe (MP).

An area of 500 μm×500 μm was arbitrarily designated twelve times within the cut wafer sample, the number of defects was checked in the respective areas, the average defect number per unit area was calculated and the defect density was found, and the result was shown in Table 1.

Experimental Example—Measurement of Reduced Elastic Modulus and Hardness According to Nanoindentation Test of Silicon Carbide Wafer For measuring reduced elastic modulus and hardness of the silicon carbide wafer samples prepared in the Example and Comparative Example, a nanoindentation test was performed by using TI-950 device available from BRUKER. A diamond indenter in a trigonal pyramid (Berkovich) shape having a height of 1 μm, a base plane in an equilateral triangle shape, a side plane having an angle of 24.7° with the base plane among three side planes, remaining two side planes having an angle of 12.95° with the base plane, a Young's modulus of 1140 GPa, and a Poisson's ratio of 0.07 was used, and while this is added to arbitrary ten points of C surface on the silicon carbide, the time to reach a maximum load of 10 mN was adjusted to be 5 seconds, the maximum load was kept for 1 second, and after the keeping, a time for unloading was set to be 5 seconds. The result of measurement in this manner and the calculated average values were shown in Table 2.

Figure 6A:
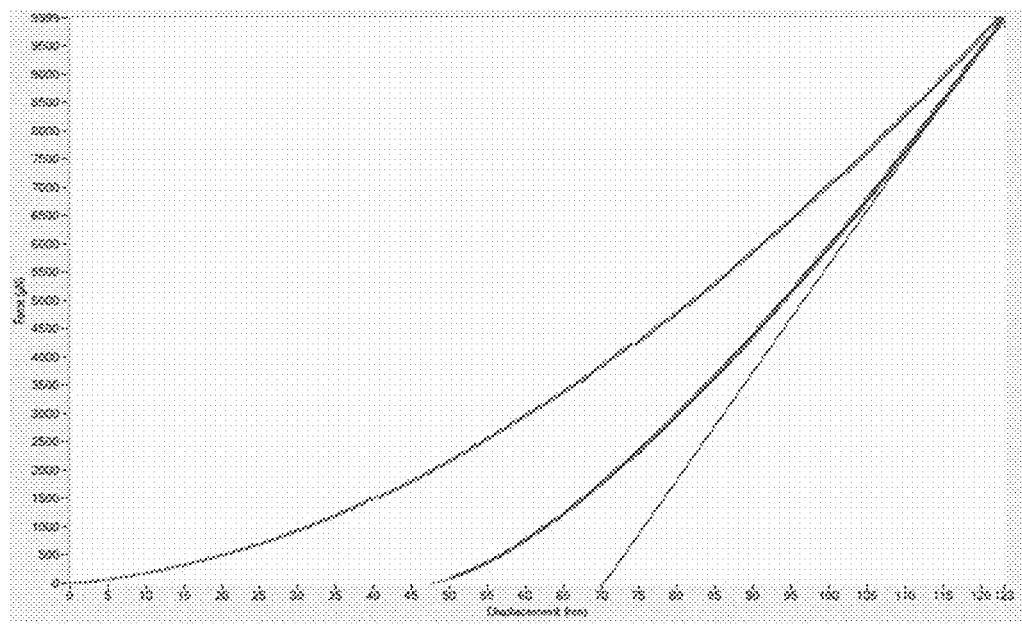
FIGS. 6A and 6B are graphs for showing a load-dislocation curve and a gradient at a maximum load when indentation and unloading of an indenter are performed according to a nanoindentation test for C surface (6A) and Si surface (6B) of the silicon carbide wafer in the tenth measurement of Example 2, the first line from the left is a graph when the indenter is loading, the second line from the left is a graph when the indenter is unloading, and the third line from the left indicates the slope at the maximum load.
Figure 6B:
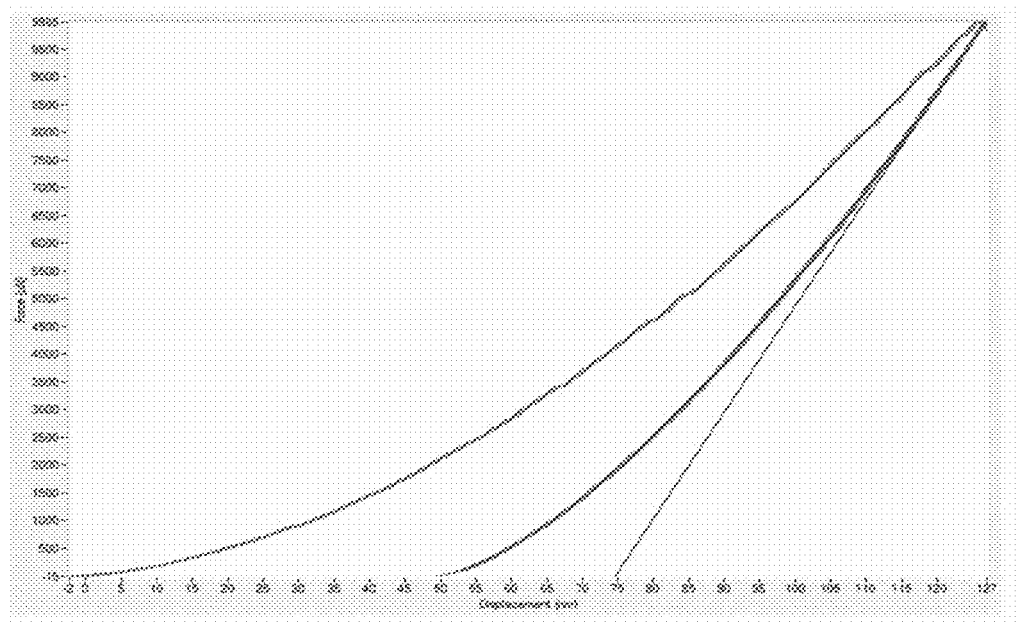

In addition, from Example 2, the detailed result of a nanoindentation test performed in arbitrary ten points on the C surface and arbitrary ten points on the Si surface of the silicon carbide wafer was shown in Table 3 and Table 4, and when the tenth measurement was performed, the views of the C surface (a) and the Si surface (b) of the silicon carbide were shown in FIG. 5, and the load-dislocation curves and gradients at a maximum load of the C surface (a) and the Si surface (b) were shown in FIG. 6.

TABLE 1

| | Flow Quantity of Inert Gas during Growing (sccm) | Flow Quantity of Inert Gas during Cooling (sccm) | Thermal Conductivity of Reactor (W/mK) | MP | TED | BPD |
|---|---|---|---|---|---|---|
| Example 1 | 200 | 200 | 95 | 0.8 | 6480 | 2480 |
| Example 2 | 150 | 200 | 96 | 1 | 6840 | 2520 |
| Example 3 | 200 | 10 | 92 | 1 | 7120 | 2820 |
| Example 4 | 200 | 200 | 105 | 0.8 | 7880 | 2720 |
| Example 5 | 150 | 200 | 85 | 0.9 | 7280 | 2960 |
| Example 6 | 250 | 200 | 108 | 0.8 | 8280 | 2640 |
| Example 7 | 200 | 250 | 95 | 0.9 | 8600 | 2760 |
| Example 8 | 200 | 150 | 95 | 0.8 | 7920 | 2980 |
| Example 9 | 200 | 200 | 120 | 0.8 | 8910 | 2960 |
| Example 10 | 200 | 200 | 88 | 1 | 7920 | 3000 |
| Example 11 | 200 | 200 | 108 | 0.7 | 5680 | 2840 |
| Example 12 | 200 | 200 | 114 | 0.8 | 9660 | 2560 |
| Example 13 | 200 | 200 | 122 | 0.9 | 8680 | 2360 |
| Example 14 | 200 | 200 | 130 | 0.9 | 6840 | 2920 |
| Example 15 | 250 | 200 | 95 | 0.7 | 7200 | 2800 |
| Example 16 | 250 | 200 | 114 | 0.6 | 7280 | 2880 |
| Example 17 | 200 | 150 | 108 | 0.8 | 6840 | 2520 |
| Example 18 | 200 | 150 | 122 | 0.9 | 8240 | 2820 |

TABLE 1-continued

| | Flow Quantity of Inert Gas during Growing (sccm) | Flow Quantity of Inert Gas during Cooling (sccm) | Thermal Conductivity of Reactor (W/mK) | MP | TED | BPD |
|---|---|---|---|---|---|---|
| Comparative Example 1 | 200 | 200 | 130 | 1 | 10480 | 3680 |
| Comparative Example 2 | 200 | 300 | 98 | 1.2 | 9660 | 2960 |
| Comparative Example 3 | 350 | 200 | 95 | 1.3 | 11240 | 3160 |
| Comparative Example 4 | 300 | 300 | 130 | 1.2 | 10480 | 3680 |

MP: Micropipe, TED: Threading Edge Dislocation, BPD: Basal Plane Dislocation

TABLE 2

| | Flow Quantity of Inert Gas during Growing (sccm) | Flow Quantity of Inert Gas during Cooling (sccm) | Thermal Conductivity of Reactor (W/mK) | Er (GPa) | H (GPa) | Er Standard Deviation (GPa) | H Standard Deviation (GPa) |
|---|---|---|---|---|---|---|---|
| Example 1 | 200 | 200 | 95 | 349.34 | 43.11 | — | — |
| Example 2 | 150 | 200 | 96 | 338.60 | 40.85 | 2.65 | 0.50 |
| Example 3 | 200 | 10 | 92 | 326.46 | 37.09 | — | — |
| Example 4 | 200 | 200 | 105 | 323.28 | 42.19 | — | — |
| Example 5 | 150 | 200 | 85 | 343.61 | 42.22 | — | — |
| Example 6 | 250 | 200 | 108 | 328.33 | 36.29 | — | — |
| Example 7 | 200 | 250 | 95 | 328.04 | 37.44 | — | — |
| Example 8 | 200 | 150 | 95 | 326.68 | 37.70 | — | — |
| Example 9 | 200 | 200 | 120 | 324.33 | 36.48 | — | — |
| Example 10 | 200 | 200 | 88 | 338.60 | 40.85 | — | — |
| Example 11 | 200 | 200 | 108 | 339.54 | 41.25 | — | — |
| Example 12 | 200 | 200 | 114 | 335.95 | 40.19 | — | — |
| Example 13 | 200 | 200 | 122 | 335.16 | 41.45 | — | — |
| Example 14 | 200 | 200 | 130 | 342.79 | 40.98 | — | — |
| Example 15 | 250 | 200 | 95 | 340.23 | 40.64 | — | — |
| Example 16 | 250 | 200 | 114 | 330.58 | 38.20 | — | — |
| Example 17 | 200 | 150 | 108 | 326.68 | 37.70 | — | — |
| Example 18 | 200 | 150 | 122 | 327.77 | 37.17 | — | — |
| Comparative Example 1 | 200 | 200 | 130 | 295.42 | 31.54 | 7.82 | 1.26 |
| Comparative Example 2 | 200 | 300 | 98 | 294.45 | 32.39 | | |
| Comparative Example 3 | 350 | 200 | 95 | 288.45 | 33.22 | 5.71 | 1.16 |
| Comparative Example 4 | 300 | 300 | 130 | 298.42 | 34.54 | | |

Er: Reduced Elastic Modulus, H: Hardness

TABLE 3

| Example 2 C Surface | Maximum Indentation Depth (nm) | Strong Degree at Maximum Load (μN/nm) | Contacting Area of Indenter (μm²) | Er (GPa) | H (GPa) |
|---|---|---|---|---|---|
| 1 | 122.46 | 189.05 | 0.241 | 341.03 | 41.44 |
| 2 | 123.19 | 189.08 | 0.245 | 338.27 | 40.76 |
| 3 | 122.75 | 188.67 | 0.242 | 339.54 | 41.25 |
| 4 | 123.04 | 187.72 | 0.242 | 337.80 | 41.24 |
| 5 | 123.93 | 188.53 | 0.249 | 334.89 | 40.19 |
| 6 | 123.86 | 189.14 | 0.249 | 335.95 | 40.19 |
| 7 | 123.07 | 185.78 | 0.241 | 335.16 | 41.45 |
| 8 | 122.61 | 191.09 | 0.244 | 342.79 | 40.98 |
| 9 | 123.35 | 191.33 | 0.248 | 340.35 | 40.30 |
| 10 | 123.11 | 190.46 | 0.246 | 340.23 | 40.64 |

TABLE 3-continued

| Example 2<br>C Surface | Maximum<br>Indentation<br>Depth<br>(nm) | Strong Degree<br>at Maximum<br>Load<br>(μN/nm) | Contacting<br>Area of<br>Indenter<br>(μm$^2$) | Er<br>(GPa) | H<br>(GPa) |
|---|---|---|---|---|---|
| The Average | 123.14 | 198.09 | 0.245 | 338.60 | 40.85 |
| Standard<br>Deviation | — | — | — | 2.65 | 0.50 |

Strong degree of Table 3 is a strong degree showing a gradient value when unloading is performed after a maximum load in a load-dislocation curve is reached.
Er: Reduced Elastic Modulus,
H: Hardness

TABLE 4

| Example 2<br>Si Surface | Maximum<br>Indentation<br>Depth<br>(nm) | Strong Degree<br>at Maximum<br>Load<br>(μN/nm) | Contacting<br>Area of<br>Indenter<br>(μm$^2$) | Er<br>(GPa) | H<br>(GPa) |
|---|---|---|---|---|---|
| 1 | 126.70 | 190.20 | 0.27 | 321.30 | 37.72 |
| 2 | 127.66 | 194.51 | 0.28 | 328.33 | 36.29 |
| 3 | 127.59 | 192.45 | 0.27 | 326.21 | 36.59 |
| 4 | 127.49 | 194.04 | 0.27 | 328.40 | 36.48 |
| 5 | 125.93 | 190.89 | 0.26 | 330.58 | 38.20 |
| 6 | 126.88 | 191.33 | 0.27 | 328.04 | 37.44 |
| 7 | 126.63 | 189.88 | 0.27 | 326.68 | 37.70 |
| 8 | 127.91 | 191.63 | 0.27 | 324.33 | 36.48 |
| 9 | 128.59 | 186.50 | 0.27 | 316.92 | 36.78 |
| 10 | 127.01 | 191.73 | 0.27 | 327.77 | 37.17 |
| The Average | 127.24 | 191.32 | 0.27 | 326.46 | 37.09 |
| Standard<br>Deviation | — | — | — | 3.72 | 0.65 |

Strong degree of Table 4 is a strong degree showing a gradient value when unloading is performed after a maximum load in a load-dislocation curve is reached.
Er: Reduced Elastic Modulus,
H: Hardness Referring to Table 1 and Table 2, in cases of Examples, the flow quantity during growing is 100 sccm to 300 sccm, the flow quantity during cooling is 1 sccm to 250 sccm, and the thermal conductivity of a reactor is 120 W/mK or less, it can be verified that a manufactured silicon carbide wafer has a reduced elastic modulus of 300 GPa to 370 GPa, a hardness of 35 GPa to 48 GPa. Also, it can be verified that the standard deviation of the reduced elastic modulus of the manufactured silicon carbide wafer is 5.5 GPa or less, and the standard deviation of the hardness is 1.1 GPa or less in the Example compared to Comparative Examples.

In contrast, in cases of Comparative Examples, it was verified that a reduced elastic modulus of less than 296 GPa and a hardness value of less than 34 GPa were shown, and thereby desired mechanical properties were not satisfied.

Example A—Manufacture of Silicon Carbide Wafer

As one example of a manufacturing device for a silicon carbide ingot illustrated in FIG. 2, a silicon carbide powder as a raw material 300 was charged in a lower portion of the internal space of a reactor 200, and a silicon carbide seed crystal 110 was disposed in an upper portion thereof. At this time, the silicon carbide seed crystal 110 was one composed of a 4H-silicon carbide crystal in six inches and was fixed by an ordinary method to have C surface ((000-1) surface) facing to the silicon carbide raw material 300 in a lower portion of the internal space, and the reactor 200 was one having a thermal conductivity of Example in below Table 1.

A reactor 200 was sealed, the external thereof was surrounded by a heat insulating material 400, and thereafter the reactor 200 was disposed inside a quartz tube 500 having a heating coil as a heating means 600 equipped in the external. The internal space of the reactor 200 was depressurized to a vacuum atmosphere, argon gas was injected to the internal space to reach 760 torr, and after that, the internal space was depressurized again. Simultaneously, the temperature of the internal space was increased to 2300° C. in a heating rate of 5° C./min, and the flow quantity of argon gas inside a quartz tube was adjusted to be a flow quantity of Example in below Table 1 through a pipe 810 and a vacuum degassing device 700 connected to the quartz tube. A silicon carbide ingot 100 was grown on a surface of a silicon carbide seed crystal 110 opposite to a silicon carbide raw material 300 for 100 hours, under the condition of a temperature of 2300° C. and a pressure of 20 torr.

After growth, the internal space was cooled to have a temperature of 25° C. at a rate of 5° C./min, simultaneously the pressure of the internal space was adjusted to be 760 torr, and a silicon carbide ingot was retrieved. At this time, the flow quantity of argon gas inside a quartz tube was adjusted to be a flow quantity of Example in below Table 1 through a pipe 810 and a vacuum degassing device connected to the quartz tube.

The circumference surface of the retrieved silicon carbide ingot was ground to have an outer diameter of 95% compared to a maximum diameter, processed into a circumference shape having a regular outer diameter, and cut to have an off angle of 4° with (0001) surface of the silicon carbide ingot, thereby manufacturing a silicon carbide wafer having a thickness of 360 μm. Subsequently, the silicon carbide wafer was ground through a diamond wheel to flatten the thickness, and after that treated by chemical mechanical polishing through silica slurry. As illustrated in FIG. 5, an outer ring region 14 occupying a width of 10 mm in a direction from the outermost edge to the center of the polished silicon carbide wafer sample was excluded, arbitrary five points within the internal region 15 were cut to a size of 10 mm×10 mm, and thereby the silicon carbide wafer sample was prepared.

Example B—Manufacture of Silicon Carbide Wafer

In the Example A, the thermal conductivity of the reactor and the flow quantity of argon gas during growing or cooling were changed to be the condition of below Table A, and thereby a silicon carbide wafer sample was prepared.

Example C—Manufacture of Silicon Carbide Wafer

In the Example A, the thermal conductivity of the reactor and the flow quantity of argon gas during growing or cooling were changed to be the condition of below Table A, and thereby a silicon carbide wafer sample was prepared.

Comparative Example A—Manufacture of Silicon Carbide Wafer

In the Example A, the thermal conductivity of the reactor and the flow quantity of argon gas during growing or cooling were changed to be the condition of below Table A, and thereby a silicon carbide wafer sample was prepared.

TABLE A

|  | Flow Quantity of Inert Gas during Growing (sccm) | Flow Quantity of Inert Gas during cooling (sccm) | Thermal Conductivity of Reactor (W/mK) |
| --- | --- | --- | --- |
| Example A | 150 | 200 | 96 |
| Example B | 200 | 200 | 95 |
| Example C | 200 | 300 | 98 |
| Comparative Example A | 350 | 350 | 127 |

Experimental Example A—Measurement of Defect Density of Silicon Carbide Wafer

The silicon carbide wafer samples prepared in the Examples A to C and Comparative Example A were digested in molten potassium hydroxide (KOH) under the condition of 500° C. and 5 minutes to be treated by etching, and defects on the surface thereof were filmed through an electric microscope or the like. A shell shaped pit was classified into Basal Plane Dislocation (BPD), a small hexagon pit was classified into Threading Edge Dislocation (TED), and a huge black hexagon pit was classified into micropipe (MP).

An area of 500 μm×500 μm was arbitrarily designated twelve times within the cut wafer sample, the number of defects was checked in the respective areas, the average defect number per unit area was calculated and the defect density was determined, and the result was shown in Table B.

Experimental Example B—Measurement of Reduced Elastic Modulus Ratio and Hardness Ratio of First Side and Second Side According to Nanoindentation Test of Silicon Carbide Wafer For measuring reduced elastic modulus and hardness of the silicon carbide wafer samples prepared in the Examples A to C and Comparative Example A, a nanoindentation test was performed by using TI-950 device available from BRUKER. A diamond indenter in a trigonal pyramid (Berkovich) shape having a height of 1 μm based on the base plane, a base plane in an equilateral triangle shape, a side plane having an angle of 24.7° with the base plane among three side planes, remaining two side planes having an angle of 12.95° with the base plane, a Young's modulus of 1140 GPa, and a Poisson's ratio of 0.07 was used, and while this is added to arbitrary ten points of the first side (a surface where more silicon atoms are exposed than carbon atoms) and the second side (a surface where more carbon atoms are exposed than silicon atoms) of the silicon carbide, respectively, the time to reach a maximum load of 10 mN was adjusted to be 5 seconds, the maximum load was kept for 1 second, and after the keeping, the time for unloading was set to be 5 seconds. After the measurement in this manner and calculation of the average value, reduced elastic modulus ratio (Ec:Esi) and hardness ratio (Hc:Hsi) were shown in Table B.

TABLE B

|  | MPD (/cm²) | TED (/cm²) | BPD (/cm²) | Ec (GPa) | Esi (GPa) | Ec/Esi | Hc (GPa) | Hsi (GPa) | Hc/Hsi |
| --- | --- | --- | --- | --- | --- | --- | --- | --- | --- |
| Example A | 0.98 | 6840 | 2520 | 338.6 | 326.5 | 1.04 | 40.9 | 37.1 | 1.10 |
| Example B | 0.96 | 7880 | 2920 | 328.1 | 313.5 | 1.05 | 40.1 | 39.8 | 1.01 |
| Example C | 0.98 | 7960 | 3000 | 326.5 | 307.4 | 1.06 | 39.1 | 38.1 | 1.03 |
| Comparative Example A | 3.2 | 10400 | 5640 | 331.2 | 275.0 | 1.20 | 40.6 | 33.7 | 1.20 |

MP: Micropipe, TED: Threading Edge Dislocation, BPD: Basal Plane Dislocation Ec: Reduced Elastic Modulus of the Other Side, Esi: Reduced Elastic Modulus of One Side, Hc: Hardness of the Other Side, His: Hardness of One Side Referring to Table B, in cases of Examples, the flow quantity during growing is 100 sccm to 300 sccm, the flow quantity during cooling is 1 sccm to 250 sccm, and the thermal conductivity of a reactor is 120 W/mK or less, and it can be verified that the manufactured silicon carbide wafer has a ratio Ec/Esi of 0.8 to 1.15, which is a ratio of reduced elastic modulus of the second side/the first side, and a ratio Hc/Hsi of 0.85 to 1.15, which is a ratio of hardness of the second side/the first side, and shows a good numerical value of defect density. In a case of Example A, it was shown that the standard deviation of reduced elastic modulus of the second side was 2.65 GPa, the standard deviation of hardness of the second side was 0.5 GPa, the standard deviation of reduced elastic modulus of the first side is 3.72 GPa, and the standard deviation of hardness of the first side is 0.65 GPa.

In contrast, in a case of Comparative Example, whose thermal conductivity of the reactor and flow quantity of the inert gas during growing or cooling did not fall within the range of Example, it was verified that the Ec/Esi and Hc/Hsi did not satisfy a desired ratio and the numerical value of defect density was also not good compared to that of Example.

Experimental Example C—Measurement of Impact Resistance of Wafer

Impact resistance experiments for the silicon carbide wafer samples prepared in the Examples A to C and Comparative Example A were performed through a DuPont Impact Tester at an atmosphere of 25° C. according to ASTM D 2794. An impactor having a flat portion for adding impact with a diameter of 4 mm was equipped in the center on the first surface of the silicon carbide wafer sample, a holder was equipped on the second surface, and a weight was dropped under the same condition as below Table C to add impact to the impactor and the wafer sample, thereby performing an experiment.

TABLE C

| Impactor | Weight of 25 g, Impactor Diameter of 4 mm, Impactor Area of 12.6 mm² | | | | |
|---|---|---|---|---|---|
| Height | 50 mm | 100 mm | 150 mm | 200 mm | 250 mm |
| Example B | ○ | ○ | X | — | — |
| Comparative Example A | X | — | — | — | — |

X: Crack Occurrence,
○: Crack Nonoccurrence,
—: Untested

Referring to Table C, in a case of Example having a gas flow quantity of 100 sccm to 300 sccm in an ingot growth operation when a silicon carbide wafer is manufactured, a crack occurred at a height for dropping a weight of 100 mm or more and less than 150 mm, and in a case of Comparative Example a crack occurred at a height for dropping a weight of 50 mm or less, and thereby degraded impact resistance was verified.

Example i—Manufacture of Silicon Carbide Wafer

As one example of a manufacturing device of the silicon carbide ingot illustrated in FIG. 2, a silicon carbide powder as a raw material 300 was charged in a lower portion of the internal space of a reactor 200, and a silicon carbide seed crystal 110 was disposed in an upper portion thereof. At this time, the silicon carbide seed crystal 110 was composed of a 4H-silicon carbide crystal in six inches and was fixed to have C surface ((000-1 surface) facing to the silicon carbide raw material 300 in a lower portion of the internal space, and the reactor 200 was one having a thermal conductivity of below Table 1.

The reactor 200 was sealed, the external thereof was surrounded by a heat insulating material 400, and thereafter the reactor 200 was disposed inside a quartz tube 500 having a heating coil as a heating means 600 equipped in the external. The internal space of the reactor 200 was depressurized to a vacuum atmosphere, argon gas was injected to the internal space to reach 760 torr, and after that, the internal space was depressurized again. Simultaneously, the temperature of the internal space was increased to 2300° C. at a heating rate of 5° C./min, and the flow quantity of argon gas inside a quartz tube was adjusted to be a flow quantity of Example in below Table 1 through a pipe 810 and a vacuum degassing device 700 connected to the quartz tube. A silicon carbide ingot 100 was grown on a surface of a silicon carbide seed crystal 110 opposite to a silicon carbide raw material 300 for 100 hours, under the condition of a temperature of 2300° C. and a pressure of 20 torr.

After growth, the internal space was cooled to have a temperature of 25° C. at a rate of 5° C./min, simultaneously the pressure of the internal space was adjusted to be 760 torr, and a silicon carbide ingot was retrieved. At this time, the flow quantity of argon gas inside a quartz tube was adjusted to be a flow quantity of Example in below Table i through a pipe 810 and a vacuum degassing device connected to the quartz tube.

Figure 8:
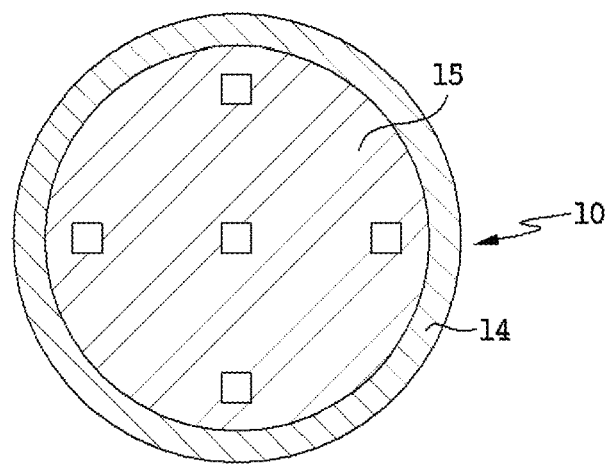
FIG. 8 is a conceptual view for showing examples of a ring area 14 and an internal region 15 of a silicon carbide wafer and one example of the internal region equipped with a sample according to embodiments.

The circumference surface of the retrieved silicon carbide ingot was ground to have an outer diameter of 95% compared to a maximum diameter, processed into a circumference shape having a regular outer diameter, and cut to have an off angle of 4° with (0001) surface of the silicon carbide ingot, thereby manufacturing a silicon carbide wafer having a thickness of 360 μm. Subsequently, the silicon carbide wafer was ground through a diamond wheel to flatten the thickness, and after that treated by chemical mechanical polishing through silica slurry. As illustrated in FIG. 8, an outer ring region 14 occupying a width of 10 mm in a direction from the outermost edge to the center of the polished silicon carbide wafer sample was excluded, arbitrary five points within the internal region 15 were cut to a size of 10 mm×10 mm, and thereby the silicon carbide wafer sample was prepared.

Example ii—Manufacture of Silicon Carbide Wafer

A silicon carbide wafer sample was prepared under the same condition as the example i.

Comparative Example i—Manufacture of Silicon Carbide Wafer

In the Example i, the thermal conductivity of the reactor, the flow quantity of argon gas during growing or cooling were changed to be the condition of below Table i, thereby preparing a silicon carbide wafer sample.

TABLE i

|  | Flow Quantity of Inert Gas during Growing (sccm) | Flow Quantity of Inert Gas during Cooling (sccm) | Thermal Conductivity of reactor (W/mK) |
|---|---|---|---|
| Example i | 200 | 200 | 95 |
| Example ii | 200 | 200 | 98 |
| Comparative Example i | 350 | 350 | 127 |

Experimental Example i—Measurement of Defect Density of Silicon Carbide Wafer

The silicon carbide wafer samples prepared in the Example and Comparative Example were digested in molten potassium hydroxide (KOH) under the condition of 500° C. and 5 minutes to be treated by etching, and defects in the surface thereof were filmed through an electric microscope or the like as illustrated in FIG. 4. A shell shaped pit was classified into Basal Plane Dislocation (BPD), a small hexagon pit was classified into Threading Edge Dislocation (TED), and a huge black hexagon pit was classified into micropipe (MP).

An area of 500 μm×500 μm was arbitrarily designated twelve times within the cut wafer sample, the number of defects was checked in the respective areas, the average defect number per unit area was calculated and the defect density was determined, and the result was shown in Table ii.

Experimental Example ii—Regression to Quadratic Polynomial of the Result of Indentation Quantity (y) Depending on Load (x) in Nanoindentation Test and Measurement of Reduced Elastic Modulus, Hardness, and Surface For measuring reduced elastic modulus and hardness of the silicon carbide wafer samples prepared in the Examples i to ii and Comparative Example i, a nanoindentation test was performed by using TI-950 device available from BRUKER. A diamond indenter in a trigonal pyramid (Berkovich) shape having a height of 1 μm, a base plane in an equilateral triangle shape, a side plane having an angle of 24.7° with the base plane among three side planes, remaining two side planes having an angle of 12.95° with the base plane, a Young's modulus of 1140 GPa, and a Poisson's ratio of 0.07 was used, and while this is added to arbitrary ten points of the first side (a surface where a silicon atom layer is exposed) and the second side (a surface where a carbon atom layer is exposed) of the silicon carbide, respectively, the time to reach a maximum load of 10 mN was adjusted to be 5 seconds, the maximum load was kept for 1 second, and after the keeping, a time for unloading was set to be 5 seconds. After the measurement in this manner, the result data of indentation quantity (y) depending on load (x) of an indenter was regressed to a quadratic polynomial through a program such as Python and MS-Excel, and the average values of reduced elastic modulus and hardness were calculated and shown in Tables ii to v.

TABLE ii

|  | MPD ($/cm^2$) | TED ($/cm^2$) | BPD ($/cm^2$) | Er of the Other Side (GPa) | H of the Other Side (GPa) |
|---|---|---|---|---|---|
| Example i | 0.75 | 6840 | 2960 | 340.35 | 40.30 |
| Example ii | 0.88 | 7280 | 2920 | 350.43 | 42.70 |
| Comparative Example i | 1.5 | 11200 | 5640 | 298.12 | 32.50 |

MP: Micropipe,
TED: Threading Edge Dislocation,
BPD: Basal Plane Dislocation,
Er: Reduced Elastic Modulus,
H: Hardness TABLE iii

|  | Load (x)-Indentation Quantity (y) Quadratic Polynomial of One Surface (Si Surface) | Quadratic Coefficient (a) | Linear Coefficient (b) | Invariable (c) |
|---|---|---|---|---|
| Example i | $y = 0.523x^2 + 18.98x - 84.72$ | 0.523 | 18.98 | -84.72 |
| Example ii | $y = 0.492x^2 + 20.25x - 90.84$ | 0.492 | 20.25 | -90.84 |
| Comparative Example i | $y = 0.303x^2 + 33.88x - 220.1$ | 0.303 | 33.88 | -220.1 |

TABLE iv

| Number | Load (x)-Indentation Quantity (y) Quadratic Polynomial of One Surface (Si Surface) in Example i | Load (x)-Indentation Quantity (y) Quadratic Polynomial of the Other Side (C Surface) in Example i |
|---|---|---|
| 1 | $y = 0.523x^2 + 19.28x - 73.03$ | $y = 0.496x^2 + 18.28x - 88.67$ |
| 2 | $y = 0.517x^2 + 19.22x - 79.58$ | $y = 0.484x^2 + 19.29x - 91.19$ |
| 3 | $y = 0.530x^2 + 18.33x - 80.63$ | $y = 0.491x^2 + 19.07x - 102.1$ |
| 4 | $y = 0.524x^2 + 18.73x - 94.73$ | $y = 0.494x^2 + 18.98x - 92.57$ |
| 5 | $y = 0.527x^2 + 17.83x - 76.36$ | $y = 0.476x^2 + 20.36x - 112.4$ |
| 6 | $y = 0.525x^2 + 19.61x - 86.21$ | $y = 0.466x^2 + 21.06x - 136.3$ |
| 7 | $y = 0.525x^2 + 18.67x - 94.05$ | $y = 0.475x^2 + 18.56x - 100.5$ |
| 8 | $y = 0.509x^2 + 20.18x - 93.17$ | $y = 0.491x^2 + 19.20x - 73.72$ |

TABLE v

| Number | Load (x)-Indentation Quantity (y) Quadratic Polynomial of One Surface (Si Surface) in Example ii | Load (x)-Indentation Quantity (y) Quadratic Polynomial of the Other Side (C Surface) in Example ii |
|---|---|---|
| 1 | $y = 0.456x^2 + 23.57x - 99.41$ | $y = 0.444x^2 + 20.96x - 44.24$ |
| 2 | $y = 0.503x^2 + 14.51x - 77.01$ | $y = 0.438x^2 + 24.15x - 179.9$ |
| 3 | $y = 0.508x^2 + 22.79x - 54.35$ | $y = 0.482x^2 + 23.10x - 167.5$ |
| 4 | $y = 0.461x^2 + 23.07x - 88.68$ | $y = 0.468x^2 + 22.68x + 3.08$ |
| 5 | $y = 0.507x^2 + 19.23x - 117.2$ | $y = 0.455x^2 + 22.50x - 15.98$ |
| 6 | $y = 0.524x^2 + 10.01x - 56.13$ | $y = 0.406x^2 + 27.91x - 197.1$ |
| 7 | $y = 0.513x^2 + 22.99x - 95.66$ | $y = 0.492x^2 + 16.31x - 100.3$ |
| 8 | $y = 0.467x^2 + 25.86x - 138.3$ | $y = 0.471x^2 + 25.84x - 367.4$ |

Referring to Tables ii to v, in cases of Examples, the flow quantity of an inert gas during growing is 100 sccm to 300 sccm, the flow quantity of an inert gas during cooling is 1 sccm to 200 sccm, and the thermal conductivity of the reactor is 85 W/mK to 125 W/mK, it can be verified that a quadratic coefficient is in a range of 0.37 to 0.6 and a linear coefficient is in a range of 10 to 33, in a quadratic polynomial obtained by polynomial regression of the result of load-indentation quantity according to the nanoindentation test of the manufactured silicon carbide wafer.

Experimental Example iii—Measurement of Impact Resistance of Wafer

Impact resistance experiments for the silicon carbide wafer samples prepared in the Examples i to ii and Comparative Example i were performed through a DuPont Impact Tester at an atmosphere of 25° C. according to ASTM D 2794. An impactor having a flat portion for adding impact with a diameter of 4 mm was equipped in the center on the first surface of the silicon carbide wafer sample, a holder was equipped on the second surface, and a weight was dropped under the same condition as below Table vi to add impact to the impactor and the wafer sample, thereby performing the experiment.

TABLE vi

| Impactor | Weight of 25 g, Impactor Diameter of 4 mm, Impactor Area of 12.6 mm² | | | | |
|---|---|---|---|---|---|
| Height | 50 mm | 100 mm | 150 mm | 200 mm | 250 mm |
| Example i | ○ | ○ | X | — | — |
| Comparative Example i | X | — | — | — | — |

X: Crack Occurrence,
○: Crack Nonoccurrence,
—: Untested

Referring to Table vi, in a case of Example having a gas flow quantity of 100 sccm to 300 sccm in an ingot growth operation when the silicon carbide wafer is manufactured, a crack occurred at a height for dropping a weight of 100 mm or more and less than 150 mm, and in a case of Comparative Example a crack occurred at a height for dropping a weight of 50 mm or less, and thereby degraded impact resistance was verified.

While specific examples have been shown and described above, it will be apparent after an understanding of the disclosure of this disclosure that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of preparing a silicon carbide ingot comprising:
   disposing a raw material and a silicon carbide seed crystal to be separated in a reactor having an internal space;
   adjusting a temperature, a pressure, and an atmosphere of the internal space for sublimating the raw material and growing the silicon carbide ingot on the silicon carbide seed crystal; and
   cooling the reactor and retrieving the silicon carbide ingot,
   wherein the adjusting proceeds in a first inert gas atmosphere having a flow quantity of 100 sccm to 300 sccm, the cooling proceeds in a second inert gas atmosphere having a flow quantity of 1 sccm to 250 sccm, and the reactor has a thermal conductivity of 120 W/mK or less.

2. The method of claim 1, wherein the reactor has a thermal conductivity of 85 W/mK or more.

3. The method of claim 1, wherein the reactor comprises:
   a heat insulating material surrounding the reactor;
   a reacting chamber disposed in the internal space; and
   a heating means disposed in an external space of the reacting chamber,
   wherein the heat insulating material has a thermal conductivity of 1.24 W/mK or less at 2000° C.

4. The method of claim 1, wherein the silicon carbide seed crystal has a diameter of four inches or more and comprises a 4H-silicon carbide structure.

5. A method of preparing a silicon carbide wafer comprising:
   disposing a raw material and a silicon carbide seed crystal to be separated in a reactor having an internal space;
   adjusting a temperature, a pressure, and an atmosphere of the internal space for sublimating the raw material and growing a silicon carbide ingot on the silicon carbide seed crystal;
   cooling the reactor and retrieving the silicon carbide ingot; and
   cutting the silicon carbide ingot to prepare the silicon carbide wafer,
   wherein the adjusting proceeds in a first inert gas atmosphere having a flow quantity of 100 sccm to 300 sccm, the cooling proceeds in a second inert gas atmosphere having a flow quantity of 1 sccm to 250 sccm, and the reactor has a thermal conductivity of 120 W/mK or less.

6. The method of claim 5, further comprising wrapping and surface polishing the silicon carbide wafer after the cutting.

7. A silicon carbide wafer prepared from the method of claim 5.

8. The silicon carbide wafer of claim 7, wherein the silicon carbide wafer has a diameter of four inches or more, comprises a 4H-silicon carbide structure, and comprises: a Si surface as a first side, where a silicon atom layer is exposed on the Si surface; and a C surface as a second side, where a carbon atom layer is exposed on the C surface.

9. The silicon carbide wafer of claim 7, wherein the silicon carbide wafer has a crack occurrence dropping weight height of 100 mm or more, which is measured by a DuPont impact tester with a sample having a thickness of 360 μm and a weight of 25 g.

10. The silicon carbide wafer of claim 7, wherein the silicon carbide wafer is a bare wafer, which does not comprise an epitaxial layer on its surface.

11. The silicon carbide wafer of claim 7, wherein the silicon carbide wafer has a diameter of four inches or more and comprises a 4H-silicon carbide.

12. The silicon carbide wafer of claim 7, wherein the silicon carbide wafer comprises, a first side where a silicon atom layer is exposed on a surface of the first side and a second side where a carbon atom layer is exposed on a surface of the second side, and, when a nanoindentation test is performed, an indenter in a trigonal pyramid shape adds indentation to the silicon carbide wafer, and indentation quantity (x) depending on load (y) is regressed as $y=ax^2+bx+c$ type quadratic polynomial from beginning of indentation to 10 mN, where a is 0.37 to 0.6, and b is 10 to 33.

13. A semiconductor device comprising:
the silicon carbide wafer of claim 7;
an epitaxial layer disposed on a first side of the silicon carbide wafer;
a barrier area disposed on the epitaxial layer;
a source electrode disposed in contact with the epitaxial layer;
a gate electrode disposed on the barrier area; and
a drain electrode disposed on a second side of the silicon carbide wafer.

14. The silicon carbide wafer of claim 7, wherein the silicon carbide wafer has a reduced elastic modulus of 300 GPa to 370 GPa, and a hardness of 35 GPa to 48 GPa, where the reduced elastic modulus and the hardness are measured according to a nanoindentation test, in which an indenter in a trigonal pyramid (Berkovich) shape is added in a load of 10 mN, and the nanoindentation test measures arbitrary ten points, except for a ring area occupying a width of 10 mm in a direction from an outermost edge to a center of the silicon carbide wafer.

15. The silicon carbide wafer of claim 14, wherein the reduced elastic modulus has a standard deviation of 5.5 GPa or less, and the hardness has a standard deviation of 1.1 GPa or less.

16. The silicon carbide wafer of claim 7, wherein the silicon carbide wafer comprises, a first side where more silicon atoms than carbon atoms are exposed on a surface of the first side and a second side where more carbon atoms than silicon atoms are exposed on a surface of the second side, wherein a second reduced elastic modulus of the second side Ec and a first reduced elastic modulus of the first side Esi has a ratio Ec/Esi of 0.8 to 1.15, a second hardness of the second side Hc and a first hardness of the first side His has a ratio of Hc/His of 0.85 to 1.15, the second reduced elastic modulus of the second side, the first reduced elastic modulus of the first side, the second hardness of the second side, and the first hardness of the first side are measured according to a nanoindentation test, in which an indenter in a trigonal pyramid shape is added in a load of 10 mN, and the nanoindentation test has an average value of values measured at arbitrary ten points, except for a ring area occupying a width of 10 mm in a direction from an outermost edge to a center of the silicon carbide wafer.

17. The silicon carbide wafer of claim 16, wherein the first side has a micropipe density of $1/cm^2$ or less, a Threading Edge Dislocation (TED) density of $9000/cm^2$ or less, and a Basal Plane Dislocation (BPD) density of $4000/cm^2$ or less.

18. The silicon carbide wafer of claim 16, wherein the first side has the first reduced elastic modulus Esi of 300 GPa to 350 GPa, and wherein the first reduced elastic modulus has a standard deviation of 5.5 GPa or less, and the first hardness has a standard deviation of 1.1 GPa or less.

19. The silicon carbide wafer of claim 16, wherein the indenter is a trigonal pyramid having a base plane in an equilateral triangle shape, one side plane having an angle of 24.7° with the base plane among three side planes, remaining two side planes having an angle of 12.95° with the base plane, respectively, a height of 1 μm based on the base plane, a Young's modulus of 1140 GPa, and a Poisson's ratio of 0.07.

20. The silicon carbide wafer of claim 16, wherein a hardness of the first side and a hardness of the second side are 35 GPa to 45 GPa, respectively.

\* \* \* \* \*